United States Patent
Park et al.

(10) Patent No.: US 9,472,275 B2
(45) Date of Patent: Oct. 18, 2016

(54) METHOD OF OPERATING MEMORY DEVICE USING DIFFERENT READ CONDITIONS

(71) Applicant: SAMSUNG ELECTRONICS CO., LTD., Suwon-Si, Gyeonggi-do (KR)

(72) Inventors: Hyun-Kook Park, Anyang-Si (KR); Young-Hoon Oh, Hwaseong-Si (KR); Dae-Seok Byeon, Seongnam-Si (KR); Yong-Kyu Lee, Hwaseong-Si (KR); Hyo-Jin Kwon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/698,175

(22) Filed: Apr. 28, 2015

(65) Prior Publication Data

US 2016/0035417 A1     Feb. 4, 2016

(30) Foreign Application Priority Data

Jul. 29, 2014   (KR) .................. 10-2014-0096768

(51) Int. Cl.
| | | |
|---|---|---|
| *G11C 11/00* | (2006.01) | |
| *G11C 13/00* | (2006.01) | |
| *G06F 11/00* | (2006.01) | |
| *G11C 11/16* | (2006.01) | |

(52) U.S. Cl.
CPC ............. *G11C 13/004* (2013.01); *G06F 11/00* (2013.01); *G11C 11/1673* (2013.01); *G11C 13/0033* (2013.01); *G11C 13/0004* (2013.01); *G11C 13/0007* (2013.01); *G11C 2013/0045* (2013.01); *G11C 2013/0054* (2013.01)

(58) Field of Classification Search
CPC .............. G11C 29/028; G11C 11/401; G11C 11/5642; G11C 13/004; G11C 16/28; G11C 16/349; G11C 29/44; G11C 7/22; G11C 7/12
USPC ............ 365/191, 193, 189.011, 189.05, 148, 365/158
See application file for complete search history.

(56) References Cited

U.S. PATENT DOCUMENTS

| | | |
|---|---|---|
| 8,400,814 B2 | 3/2013 | Tokiwa |
| 8,479,083 B2 | 7/2013 | Chae et al. |
| 2011/0066899 A1* | 3/2011 | Kang .................. G06F 11/1068 714/54 |
| 2012/0268994 A1 | 10/2012 | Nagashima |
| 2012/0314478 A1 | 12/2012 | Ha et al. |
| 2013/0139036 A1 | 5/2013 | Lee |
| 2013/0148435 A1 | 6/2013 | Matsunaga |
| 2013/0159785 A1 | 6/2013 | Hashimoto |
| 2013/0194883 A1 | 8/2013 | Lee |
| 2014/0075241 A1 | 3/2014 | Oh et al. |
| 2014/0082459 A1 | 3/2014 | Li et al. |
| 2014/0281767 A1* | 9/2014 | Alhussien .......... G11C 16/3404 714/721 |
| 2015/0149840 A1* | 5/2015 | Alhussien .......... H03M 13/1125 714/719 |
| 2016/0027485 A1* | 1/2016 | Park ........................ G11C 7/22 365/191 |

* cited by examiner

*Primary Examiner* — Gene Auduong
(74) *Attorney, Agent, or Firm* — Volentine & Whitt, PLLC

(57) ABSTRACT

A memory device and a method of operating the memory device are provided for performing a read-retry operation. The method of operating the memory device includes starting a read-retry mode, reading data of multiple cell regions using different read conditions, and setting a final read condition for the cell regions according to results of data determination operations on data read from the cell regions.

21 Claims, 25 Drawing Sheets

METHOD OF OPERATING MEMORY DEVICE USING DIFFERENT READ CONDITIONS

CROSS-REFERENCE TO RELATED APPLICATION

A claim for priority under 35 U.S.C. §119 is made to Korean Patent Application No. 10-2014-0096768, filed on Jul. 29, 2014, in the Korean Intellectual Property Office, the entire contents of which are hereby incorporated by reference.

BACKGROUND

The inventive concept relates to a memory device, and more particularly, to a memory device and a memory system that perform a read-retry operation, and a method of operating the memory device.

Research into next-generation memory devices that are non-volatile and do not require refresh operations is being conducted in response to demand for high capacity and low power consumption memory devices. Next-generation memory devices generally require the high integrity characteristics of Dynamic Random Access Memory (DRAM), the non-volatile characteristics of flash memory, and the high speed of static RAM (SRAM). As next-generation memory devices, Phase change RAM (PRAM), Nano Floating Gate Memory (NFGM), Polymer RAM (PoRAM), Magnetic RAM (MRAM), Ferroelectric RAM (FeRAM), and Resistive RAM (RRAM) are being highlighted.

SUMMARY

According to an aspect of the inventive concept, there is provided method of operating a memory device. The method includes starting a read-retry mode, reading data of a plurality of cell regions using different read conditions, and setting a final read condition for the cell regions, according to results of data determination operations on data read from the cell regions.

The read-retry mode may be started when a number of errors that occurs in data read from the cell regions via a normal read operation is greater than a threshold value.

The data of the cell regions may be simultaneously read and simultaneously stored in a page buffer. Also, the data of the cell regions may be sequentially read and sequentially stored in a page buffer.

The results of the data determination operations may predict a valley of a resistance level distribution of the cell regions. A read condition corresponding to the predicted valley may be set as the final read condition.

The method of operating the memory device may further include reading the data of the cell regions by commonly using the final read condition. When a number of errors that occur in the data read using the final read condition is greater than a threshold value, the method further may include repeatedly performing a read operation for the cell regions using different read conditions, and setting the final read condition according to results of the data determination operations on the read data.

The method of operating the memory device may further include reading the data of the cell regions by commonly using the final read condition. When a number of errors that occur in the data read using the final read condition is equal to or less than a threshold value, the method further may include ending the read-retry mode.

The cell regions may include a first cell region and a second cell region. First data and second data that are respectively read from the first cell region and the second cell region may be stored in a page buffer. The first data may be read from the first cell region based on a first read condition and the second data may be read from the second cell region based on a second read condition.

Each read condition includes at least one of factors comprising a clamping signal, a precharge voltage, a precharge enable signal, a reference voltage, a reference current, and a sensing enable signal that are usable in reading the data. The first read condition and the second read condition may differ from each other in at least one of the factors comprising the clamping signal, the precharge voltage, the precharge enable signal, the reference voltage, the reference current, and the sensing enable signal.

Each of the first cell region and the second cell region may be an error correction code (ECC) unit.

According to another aspect of the inventive concept, there is provided a method of operating a memory system comprising a memory cell array, which includes at least one page having a first cell region and a second cell region. The method includes starting a read-retry mode, according to a result of error detection performed on data that was read from the at least one page; storing, in a page buffer, first data read from the first cell region based on a first read condition; storing, in the page buffer, second data read from the second cell region based on a second read condition different from the first read condition; and setting a final read condition based on an analysis result of a resistance level distribution of each of the first data and the second data that are stored in the page buffer.

According to another aspect of the inventive concept, there is provided a method of a memory system comprising a memory controller. The method includes receiving, using the memory controller, data of a plurality of cell regions read based on a first normal read condition; determining whether to start a read-retry mode for the cell regions, according to a result of error detection performed on the data of the cell regions; controlling, in the read-retry mode, the data to be read from the plurality of cell regions based on different read conditions; analyzing a resistance level distribution of each of the data read from the cell regions based on the different read conditions; and controlling the data to be read from the cell regions based on a final read condition, according to the analysis result of the resistance level distribution.

According to another aspect of the inventive concept, there is provided a memory device including a memory cell array having a plurality of cell regions, a write/read circuit and control logic. The write/read circuit is configured to perform write and read operations on the memory cell array, the write/read circuit including a page buffer that stores read data. The control logic is configured to control data to be read from the cell regions based on different read conditions in a read-retry mode.

BRIEF DESCRIPTION OF THE DRAWINGS

Exemplary embodiments of the inventive concept will be more clearly understood from the following description taken in conjunction with the accompanying drawings, in which.

DETAILED DESCRIPTION OF THE EMBODIMENTS

Figure 1:
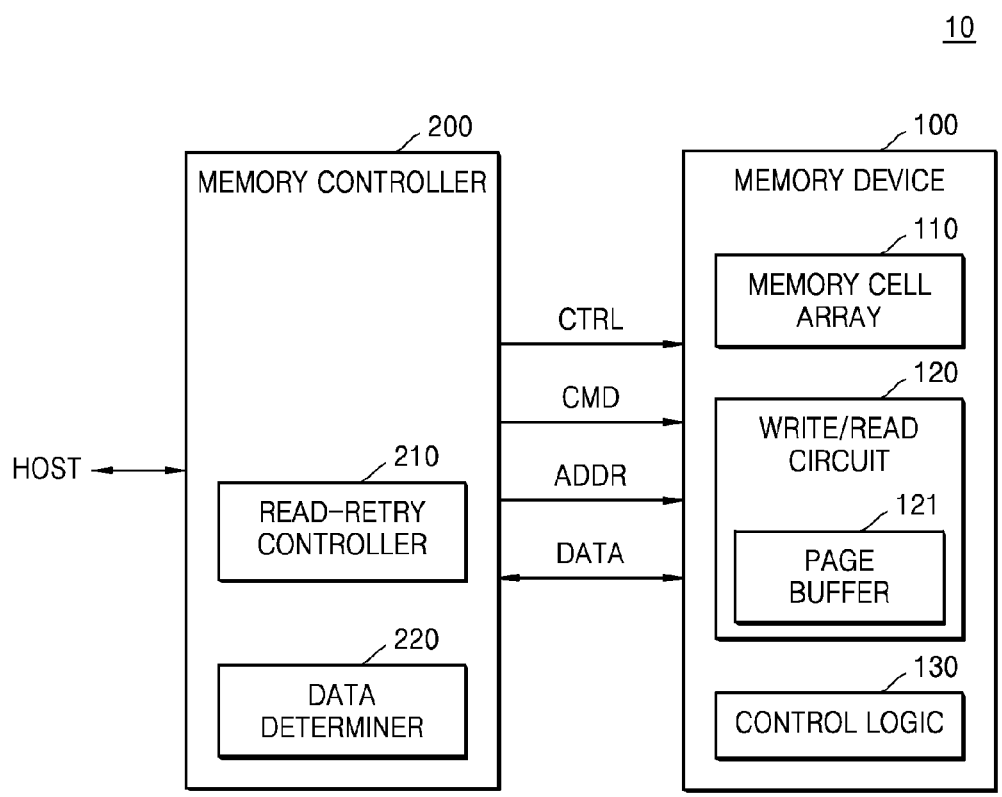
FIG. 1 is a block diagram of a memory system including a memory device, according to an embodiment of the inventive concept.

Embodiments of the inventive concept will be described more fully with reference to the following description and accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to one of ordinary skill in the art. Accordingly, known processes, elements, and techniques are not described with respect to some of the embodiments. Unless otherwise noted, like reference numerals denote like elements throughout the attached drawings and written description. In the drawings, sizes and dimensions of structures may be exaggerated for clarity.

Furthermore, all examples and conditional language recited herein are to be construed as being without limitation to such specifically recited examples and conditions. Throughout the specification, a singular form may include plural forms, unless there is a particular description contrary thereto. Also, terms such as "comprise" or "comprising" are used to specify existence of a recited form, a number, a process, an operation, a component, and/or groups thereof, not excluding the existence of one or more other recited forms, one or more other numbers, one or more other processes, one or more other operations, one or more other components and/or groups thereof.

While terms "first" and "second" are used to describe various components, it is obvious that the components are not limited to the terms "first" and "second". The terms "first" and "second" are used only to distinguish between each component. For example, a first component may indicate a second component or a second component may indicate a first component without conflicting with the inventive concept.

Unless expressly described otherwise, all terms including descriptive or technical terms which are used herein should be construed as having meanings that are obvious to one of ordinary skill in the art. Also, terms that are defined in a general dictionary and that are used in the following description should be construed as having meanings that are equivalent to meanings used in the related description, and unless expressly described otherwise herein, the terms should not be construed as being ideal or excessively formal.

As used herein, the term "and/or" includes any and all combinations of one or more of the associated listed items. Expressions such as "at least one of" when preceding a list of elements, modify the entire list of elements and do not modify the individual elements of the list. The term "exemplary" is intended to refer to an example or illustration.

FIG. 1 is a block diagram of a memory system 10 including a memory device 100, according to an embodiment of the inventive concept. In the present embodiment, the memory device 100 may include resistive memory cells and thus may be referred to as a resistive memory device. Alternatively, in the present embodiment, the memory device 100 may include various types of memory cells. Since the memory cells are disposed at cross-points of multiple first signal lines and multiple second signal lines, the memory device may be referred to as a cross-point memory device. Hereinafter, in one or more embodiments of the inventive concept, it is assumed that the memory device 100 is the resistive memory device, although embodiments of the inventive concept are not limited thereto.

Referring to FIG. 1, the memory system 10 includes the memory device 100 and a memory controller 200. The memory device 100 includes a memory cell array 110, a write/read circuit 120, and control logic 130. Also, the write/read circuit 120 includes a page buffer 121. When the memory cell array 110 includes resistive memory cells, the memory system 10 may be referred to as a resistive memory system.

In response to a write/read request from a host HOST, the memory controller 200 may read data stored in the memory device 100 or may control the memory device 100 to write data to the memory device 100. In more detail, the memory controller 200 may provide an address ADDR, a command CMD, and a control signal CTRL to the memory device 100 and thus may control a program (or write) operation, a read operation, and an erase operation with respect to the memory device 100. Also, write-target data DATA and read data DATA may be exchanged between the memory controller 200 and the memory device 100.

Also, the memory controller 200 includes a read-retry controller 210 and a data determiner 220. The memory controller 200 may perform error detection and correction on data that is provided from the memory device 100, and to do so, the memory controller 200 may further include an error correction code (ECC) unit (not shown) so as to perform the error detection and correction.

Although not illustrated, the memory controller 200 may include a Random Access Memory (RAM), a processing unit, a host interface, and a memory interface. The RAM may be used as an operation memory of the processing unit. The processing unit may control operations of the memory controller 200. The host interface may include a protocol for exchanging data between the host and the memory controller 200. For example, the memory controller 200 may communicate with an external source (i.e., the host) by using at least one of various interface protocols including Universal Serial Bus (USB), Multimedia Card (MMC), Peripheral Component Interconnect Express (PCI-E), Advanced Technology Attachment (ATA), Serial-ATA, Parallel-ATA, Small Computer System Interface (SCSI), Enhanced Small Disk Interface (ESDI), and Integrated Drive Electronics (IDE).

The memory cell array 110 includes a plurality of memory cells (not shown) that are disposed respectively in regions where first signal lines and second signal lines cross. In the present embodiment, the first signal lines may be bitlines, and the second signal lines may be wordlines. In another embodiment, the first signal lines may be wordlines, and the second signal lines may be bitlines.

Also, each of the memory cells may be a single level cell (SLC) that stores one bit data, or may be a multilevel cell (MLC) that stores at least two-bit data. Alternatively, the memory cell array 110 may include both the SLCs and the MLCs. When one bit data are written to one memory cell, the memory cells may have two resistance level distributions according to the written data. Alternatively, when two-bit data are written to one memory cell, the memory cells may have four resistance level distributions according to the written data. In another embodiment, when a memory cell is a triple level cell (TLC) that stores three-bit data, the memory cells may have eight resistance level distributions according to the written data. However, one or more embodiments of the inventive concept are not limited thereto. Thus, in other embodiment, each of the memory cells may store at least four-bit data.

In an embodiment, the memory cell array 110 may include memory cells with a two-dimensional horizontal structure. In another embodiment, the memory cell array 110 may include memory cells with a three-dimensional vertical structure.

The memory cell array 110 may include resistance-type memory cells that include a variable resistor device (not shown). For one example, when resistance of the variable resistor device that is formed of a phase change material (e.g., Ge—Sb—Te) is changed according to a temperature, a resistive memory device may be a Phase change RAM (PRAM). As another example, when the variable resistor device is formed of complex metal oxide including an upper electrode, a lower electrode, and transition metal oxide therebetween, the resistive memory device may be a Resistive RAM (RRAM). As another example, when the variable resistor device is formed of an upper electrode of a magnetic material, a lower electrode of the magnetic material, and a dielectric therebetween, the resistive memory device may be a Magnetic RAM (MRAM).

The write/read circuit 120 performs write and read operations on the memory cells. The write/read circuit 120 may be connected to the memory cells via the bitlines, and may include write drivers that write data to the memory cells, and sense amplifiers that sense resistive components of the memory cells.

The control logic 130 generally controls operations of the memory device 100, and controls the write/read circuit 120 so as to perform a memory operation such as a write operation or a read operation. For the write and read operations of the memory device 100, the control logic 130 may provide various pulse signals such as a write pulse, a read pulse, etc., to the write/read circuit 120. In response to the various pulse signals, the write/read circuit 120 may provide a write current (or a write voltage) or a read current (or a read voltage) to the memory cell array 110. A power generator (not shown) that generates the various pulse signals may be arranged inside or outside the control logic 130.

In the write operation with respect to the memory device 100, a resistance value of a variable resistor of a memory cell of the memory cell array 110 may be increased or decreased, depending on write data. For example, each of memory cells of the memory cell array 110 may have a resistance value according to data that is currently stored therein, and the resistance value may be increased or decreased, depending on data to be written to each of the memory cells. The write operation may be divided into a reset write operation and a set write operation. In a set state, a resistive memory cell may have a relatively low resistance value, and in a reset state, the resistive memory cell may have a relatively high resistance value. The reset write operation involves performing a write operation so as to increase a resistance value of a variable resistor of the resistive memory cell, and the set write operation involves performing a write operation so as to decrease the resistance value of the variable resistor of the resistive memory cell.

When a detected error of data read by the memory device 100 is not correctable, the memory controller 200 may control the memory device 100 to operate in a read-retry mode to perform a read-retry operation. Generally, during the read-retry operation, the memory device 100 reads (or re-reads) data while the memory device 100 changes a reference (e.g., a read reference) of determining data "0" and data "1", analyzes a valley in a resistance level distribution of memory cells by performing a data determination operation on the read data, and based on the analysis result, performs a recovery algorithm of selecting a read reference so as to minimize error occurrence of the data. The read-retry controller 210 may provide the memory device 100 with information related to various read references for searching for the valley in the resistance level distribution of the memory cells, and the memory device 100 may set a read condition based on the received information and perform a read operation. The read data may be provided to the memory controller 200, and the data determiner 220 may perform a data determination operation on the read data obtained by the read operation, and may generate a determination result therefrom.

In one or more embodiments, it is assumed that a read condition for a normal read operation is referred to as a "normal read condition," and a read condition for a re-read operation in a read-retry mode is referred to as a "re-read condition." However, for convenience of description, even when the normal read condition and the re-read condition are set as a read condition, it would be apparent to one of ordinary skill in the art that the read condition corresponds to the normal read condition during the normal read operation, and corresponds to the re-read condition during the read-retry mode.

The memory cell array 110 may include multiple cell regions. For example, the memory cell array 110 may include multiple pages, and each of the pages may be defined as a group of memory cells that are connected to a same signal line (e.g., a wordline) and thus is accessible by one row address. Also, each of the pages may include multiple cell regions that may be variously defined. For example, when the size of each page corresponds to 8 KB and each cell region is defined as 2 KB, one page includes four cell regions. In an embodiment, each of the cell regions may correspond to an ECC unit which performs error detection and correction.

In the present embodiment, during the read-retry mode, pieces of data are read from the cell regions according to different re-read conditions (hereinafter, a re-read condition during the read-retry mode is referred to as a "read condition"), and the pieces of read data are stored in the page buffer 121. As described above, when four cell regions are included in one page, for example, pieces of data of the four cell regions may be read according to four different read conditions (e.g., first through fourth read conditions), respectively. The read data of each of the four cell regions may be provided to the data determiner 220. The data determiner 220 may determine the data according to each of the four cell regions and may generate an analysis result with respect to a valley in a resistance level distribution of each of the four cell regions.

The read-retry controller 210 may control a next read-retry operation, based on a data determination result by the data determiner 220. For example, when a read reference for minimizing error occurrence is determined based on data determination results with respect to the four cell regions, information about the read reference may be provided to the memory device 100. The memory device 100 may set a read condition, which corresponds to the read reference, as a final read condition. The memory device 100 may control data to be read from a page by using the final read condition. That is, the pieces of data are read from the four cell regions according to the final read condition, and an error of the pieces of read data is correctable by an ECC operation.

According to the data determination results with respect to the pieces of data that are read using the first through fourth read conditions, when the read reference for minimizing the error occurrence is not determinable, reference information for setting at least one read condition that is different from the first through fourth read conditions may be provided to the memory device 100. The memory device 100 sets other four different read conditions (e.g., fifth through eighth read conditions) using the reference information, and re-reads the pieces of data of the four cell regions according to the fifth through eighth read conditions. The data determiner 220 receives the pieces of data that were read according to the fifth through eighth read conditions, determines them, and generates results of searching for valleys in resistance level distributions of the four cell regions, respectively. The read-retry controller 210 controls a next read-retry operation, based on the data determination results by the data determiner 220. Through the aforementioned procedure, the final read condition may be set, and according to the final read condition, the pieces of data may be re-read from the four cell regions.

The final read condition may be variously set. For example, when the error occurrence is minimized by a read condition from among the first through fourth read conditions, the read condition may be set as the final read condition. Alternatively, although an ECC correction range cannot be satisfied with any read condition from among the first through fourth read conditions, when a read condition capable of satisfying the ECC correction range is set by changing a portion of a read condition from among the first through fourth read conditions, the final read condition may be set by changing the read condition.

According to the present embodiment, the time required for the read-retry mode may be decreased. For example, in the present embodiment, read operations are performed on multiple cell regions that are included in one page, according to different read conditions, and an operation is performed to predict a valley in a resistance level distribution of each of the cell regions, so that the number of loops including the re-read operations and the data determination operations that are performed in the read-retry mode may be reduced. Also, when pieces of data are simultaneously read from the multiple cell regions according to the different read conditions, the time required for the read-retry mode may likewise be decreased.

The memory controller 200 and the memory device 100 may be integrated in a semiconductor device. For example, the memory controller 200 and the memory device 100 integrated in the semiconductor device may configure a memory card. Also, for example, the memory controller 200 and the memory device 100 integrated to the semiconductor device may configure a PC card (a PCMCIA card), a compact flash card (CF card), a smart media card (SM/SMC), a memory stick, a multimedia card (MMC, RS-MMC, or MMCmicro, an SD card (SD, miniSD, or microSD), or a universal flash storage (UFS). For another example, the memory controller 200 and the memory device 100 integrated in the semiconductor device and may configure a Solid State Disk/Drive (SSD).

Figure 2:
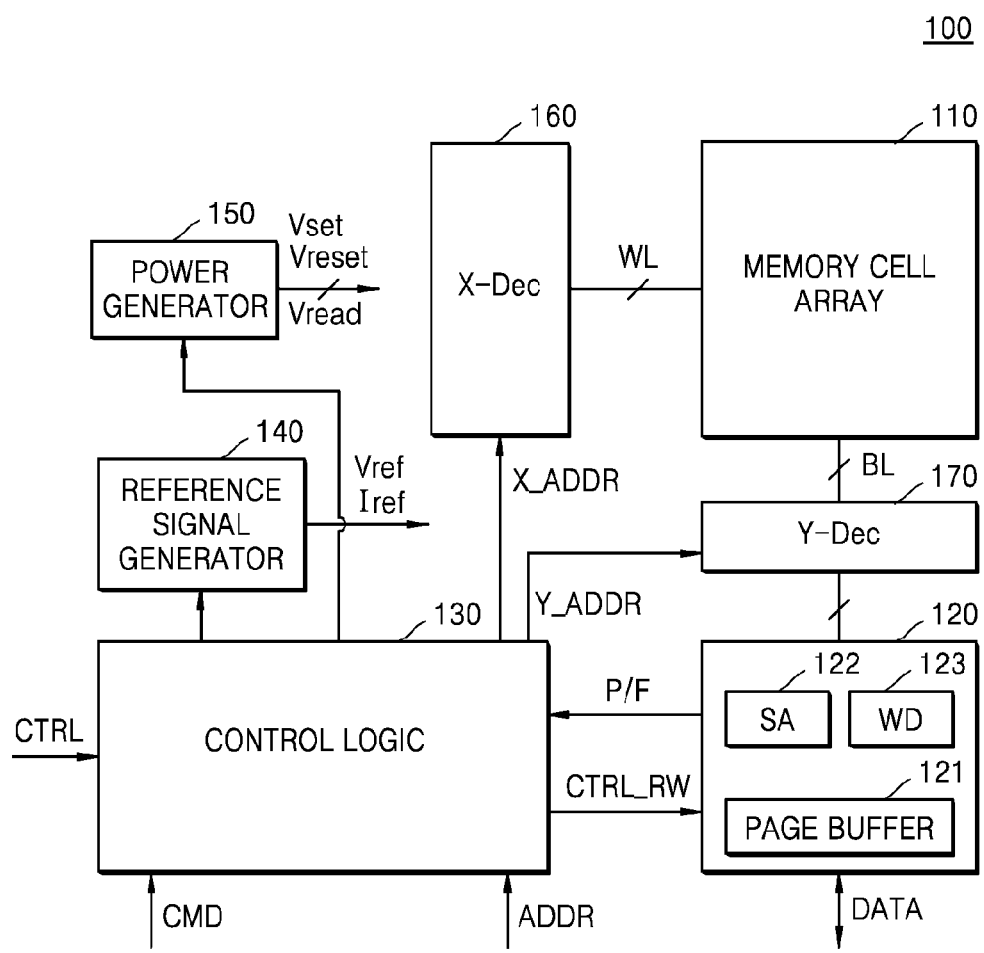
FIG. 2 is a block diagram of the memory device of FIG. 1, according to an embodiment of the inventive concept.

An operation of the memory device 100 included in the resistive memory system 10 with the aforementioned structure will be described below. FIG. 2 is a block diagram of the memory device 100 of FIG. 1, according to an embodiment of the inventive concept.

Referring to FIG. 2, the memory device 100 includes the memory cell array 110, the write/read circuit 120, and the control logic 130. Also, the memory device 100 further includes a reference signal generator 140, a power generator 150, a row decoder 160, and a column decoder 170. The write/read circuit 120 includes a page buffer 121, a sense amplifier 122, and a write driver 123. Structure and operations of the memory device 100 shown in FIG. 2 are described below.

Memory cells that are arranged in the memory cell array 110 may be connected to multiple first signal lines and multiple second signal lines. The first signal lines may be bitlines BL, and the second signal lines may be wordlines WL. Since various voltage signals or current signals are provided via the bitlines BL and the wordlines WL, data may be written to or read from selected memory cells, and writing data to or reading data from residual unselected memory cells may be prevented.

An address ADDR accompanied with a command CMD for indicating an access-target memory cell may be received. The address ADDR may include a row address X_ADDR for selecting wordlines WL of the memory cell array 110, and a column address Y_ADDR for selecting bitlines BL of the memory cell array 110. The row decoder 160 performs a wordline selecting operation in response to the row address X_ADDR, and the column decoder 170 performs a bitline selecting operation in response to the column address Y_ADDR.

The write/read circuit 120 may be connected to bitlines BL and thus may write data to a memory cell or may read data from the memory cell. For example, a set voltage Vset or a reset voltage Vreset may be provided from the power generator 150 to a selected memory cell, and in a read operation, a read voltage Vread may be provided from the power generator 150 to the selected memory cell. The write/read circuit 120 may provide a write voltage or a write current according to data to the memory cell array 110 via the column decoder 170. Also, in order to determine the data in the read operation, the write/read circuit 120 may include a comparator that is connected to a node (e.g., a sensing node) of a bitline BL, and may read a data value by performing a comparison operation on a sensing voltage or a sensing current of the sensing node. A reference voltage Vref and/or a reference current Iref may be provided to the write/read circuit 120 and thus may be used in a data determination operation. Referring to FIG. 2, the reference voltage Vref and the reference current Iref are generated by the reference signal generator 140. In other embodiments, the reference voltage Vref and the reference current Iref may be generated in the write/read circuit 120. Alternatively, the reference signal generator 140 and the power generator 150 may be integrated in the same function block.

Also, the write/read circuit 120 may provide the control logic 130 with a pass/fail signal P/F according to a read result with respect to the read data. The control logic 130 may refer to the pass/fail signal P/F and thus control write and read operations of the memory cell array 110.

The control logic 130 may output various control signals CTRL_RW for writing data to the memory cell array 110 or reading data from the memory cell array 110, based on a command CMD, an address ADDR, and a control signal CTRL received from the memory controller 200. By doing so, the control logic 130 generally controls operations in the memory device 100.

In the present embodiment, data DATA that is read by the memory device 100 via a normal read operation is provided to the memory controller 200 (refer to FIG. 1), and then the memory controller 200 performs an operation for error detection and correction on the data DATA. As a result of the error detection, when an uncorrectable error has occurred, the memory controller 200 controls the memory device 100 to operate in a read-retry mode.

During the read-retry mode, the memory device 100 sets at least two read conditions so as to read data of one page. For example, when an uncorrectable error has occurred from data of a page that was read according to a preset normal read condition, the memory device 100 sets at least two read conditions that are different from the normal read condition. As described above, the two read conditions may be set based on pieces of reference information from the memory controller 200, although the two read conditions may be set by the memory device 100 in response to control performed by the control logic 130.

During the read-retry mode, a re-read operation is performed on pieces of data of cell regions included in one page, according to different read conditions. The pieces of data of the cell regions may be simultaneously or sequentially read. The pieces of re-read data of the cell regions are stored in the page buffer 121. The pieces of re-read data stored in the page buffer 121 are provided to the memory controller 200, and then a data determination operation is performed to search for a valley of a resistance level distribution of the cell regions.

A data read condition may be variously set. For example, a voltage sensing method or a current sensing method may be applied to a data read operation, and data may be read therefrom. A resistance level distribution of resistive memory cells of the memory cell array 110 may be shifted due to various factors such as a lapse of time or interference caused by a memory operation on other memory cells, thus, when data are read using a preset reference voltage (or a reference current), an uncorrectable error may occur in the read data. In this case, the data are re-read while the level of the reference voltage (or the reference current) is varied during the read-retry mode. Since the read condition is changed in this manner, the number of errors that occur in the data generally decrease. By repeatedly performing a re-read operation in which the level of the reference voltage (or the reference current) is varied, and performing an operation of predicting a valley of the resistance level distribution thereof, a read condition for minimizing error occurrences may be found.

Various factors that are used in the re-read operation during the read-retry mode may affect a read operation. The various factors include a clamping voltage for constantly clamping a level of a voltage, a precharge voltage for precharging a bitline to a predetermined level, and/or an enable point of time for setting a sensing point of time of data. According to the present embodiment, values of the factors may vary when the read condition is set, as discussed below in more detail.

Figure 3:
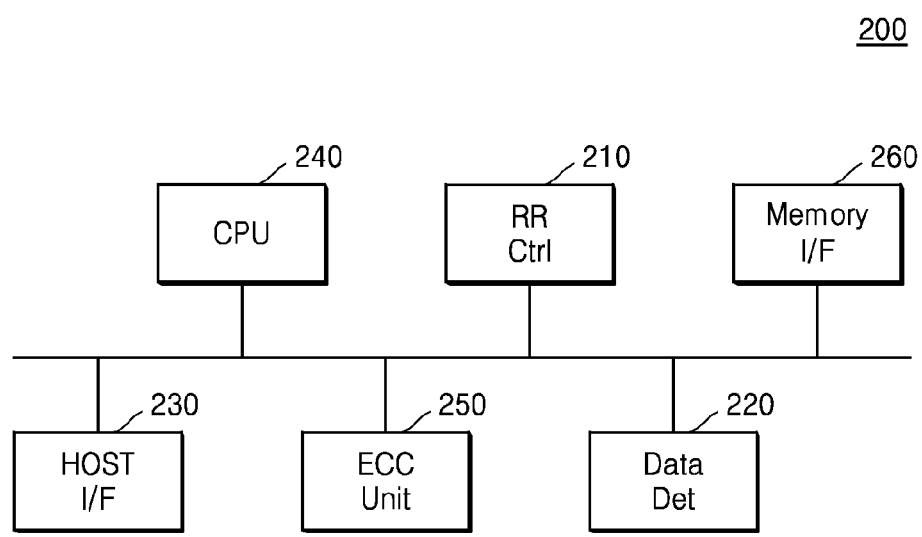
FIG. 3 is a block diagram of a memory controller of FIG. 1, according to an embodiment.

FIG. 3 is a block diagram of the memory controller 200 of FIG. 1, according to an embodiment. As shown in FIG. 3, the memory controller 200 includes the read-retry controller 210, the data determiner 220, a host interface 230, a central processing unit (CPU) 240, an ECC unit 250, and a memory interface 260.

The CPU 240 generally controls operations of the memory controller 200, e.g., the CPU 240 may control various function blocks related to a memory operation on the memory device 100. The host interface 230 interfaces with a host, including receiving a request for the memory operation from the host. For example, the host interface 230 receives, from the host, various requests including reading and writing data, and in response to the requests, the host interface 230 generates various internal signals for the memory operation on the memory device 100.

The ECC unit 250 perform an ECC encoding process on write data and an ECC decoding process on read data. For example, the ECC unit 250 may generate a result of error detection on data that is read by the memory device 100, and may generate an error correction operation on the read data. The data determiner 220 performs a data determination operation on the read data from the memory device 100, e.g., the data determiner 220 may determine a value of the read data or may determine an error of the read data by performing a processing operation (e.g., a calculation operation) on the value of the read data.

The ECC unit 250 may perform the ECC encoding process and the ECC decoding process by using an algorithm such as a Reed-Solomon (RS) code, a Hamming code, or a Cyclic Redundancy Code (CRC), for example. The ECC encoding process may include an operation of generating a parity bit, based on data to be written, and the ECC decoding process may include an operation of detecting an error bit from the read data and correcting the detected error bit. For example, the ECC unit 250 may compare a parity and a parity bit and thus may detect an error bit, where the parity is generated and is stored when data are programmed and the parity bit is generated when the data are read, and may correct the detected error bit by performing a predetermined logic operation (e.g., an XOR operation) on the detected error bit.

The ECC unit 250 may be set to have a predetermined error correction rate, and as the error correction rate is increased, the number of parity bits that are generated for data with a same size may be increased. For example, as the error correction rate is increased, more error bits of a predetermined data size (or an ECC unit) may be corrected.

The read-retry controller 210 provides various types of information for controlling an operation of the memory device 100 during the read-retry mode, as previously described. For example, the read-retry controller 210 may provide a mode signal for informing a start of the read-retry mode, may analyze a resistance level distribution of memory cells, and may provide multiple pieces of read reference information so as to predict a valley in the resistance level distribution. The memory device 100 may set different read conditions based on the pieces of read reference information and read data using the different read conditions.

The memory interface 260 interfaces with the memory device 100 to exchange various signals (e.g., command, address, mode signals, reference information, data, etc.) between the memory controller 200 and the memory device 100.

Figure 4:
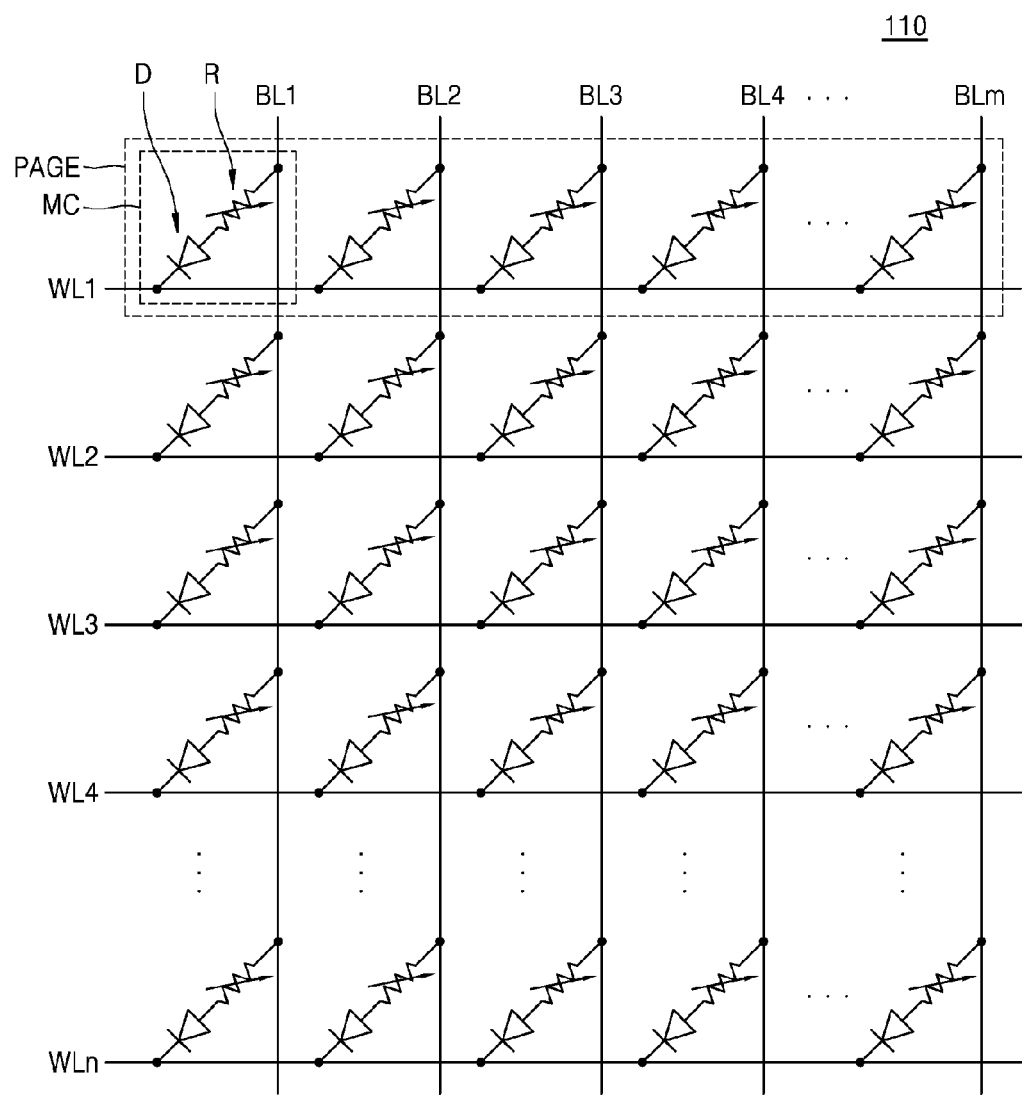
FIG. 4 is a circuit diagram illustrating an example of a memory cell array of FIG. 2.

FIG. 4 is a circuit diagram illustrating an example of the memory cell array 110 of FIG. 2. The memory cell array 110 may include multiple, and FIG. 4 shows an example of one such cell block.

Referring to FIG. 4, the memory cell array 110 includes multiple wordlines WL1 through WLn, multiple bitlines BL1 through BLm, and multiple memory cells MC. Here, the number of the wordlines WL, the number of the bitlines BL, and the number of the memory cells MC may vary according to one or more embodiments. Also, the memory cells MC connected to one wordline may be defined as a page unit PAGE.

Each of the memory cells MC may include a variable resistor R and a selection device D. Here, the variable resistor R may be referred to as a variable resistor device or a variable resistor material, and the selection device D may be referred to as a switching device.

In the depicted embodiment, the variable resistor R is connected between one of the bitlines BL1 through BLm and the selection device D, and the selection device D is connected between the variable resistor device R and one of the wordlines WL1 through WLn. However, embodiments of the inventive concept are not limited thereto. For example, the selection device D may be connected between one of the bitlines BL1 through BLm and the variable resistor R, and the variable resistor R may be connected between the selection device D and one of the wordlines WL1 through WLn.

The variable resistor R may be changed to one of multiple resistive states, e.g., in response to an electric pulse applied thereto. The variable resistor R may include a phase-change material having a crystal state that changes according to a current. The phase-change material may include various materials, such as GaSb, InSb, InSe, or Sb2Te3 obtained by compounding two elements, GeSbTe, GaSeTe, InSbTe, SnSb2Te4, or InSbGe obtained by compounding three elements, or AgInSbTe, (GeSn)SbTe, GeSb(SeTe), Te81Ge15Sb2S2 obtained by compounding four elements.

The phase-change material may have an amorphous state that is relatively high-resistive, and a crystal state that is relatively low-resistive. A phase of the phase-change material may be changed by Joule's heat that is generated by the current. Using changes of the phase, data may be written.

In another embodiment, the variable resistor R may not include the phase-change material, but may include perovskite compounds, transition metal oxide, magnetic materials, ferromagnetic materials, or antiferromagnetic materials, for example.

The selection device D may be connected between one of the wordlines WL1 through WLn and the variable resistor R, and according to a voltage applied to the connected wordline and bitline, a current that is supplied to the variable resistor R is controlled. In the present embodiment, the selection device D may be a PN-junction diode or a PIN-junction diode. An anode of a diode may be connected to the variable resistor R, and a cathode of the diode may be connected to one of the wordlines WL1 through WLn. Here, when a voltage difference between the anode and the cathode of the diode is greater than a threshold voltage of the diode, the diode is turned on so that the current is supplied to the variable resistor R.

Figure 5A:
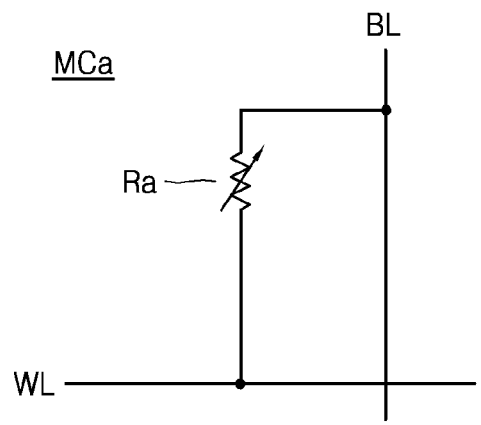
FIGS. 5A through 5C are circuit diagrams of modified examples of a memory cell of FIG. 4.
Figure 5B:
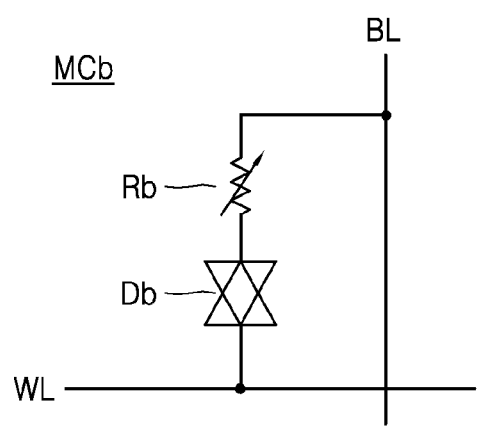
Figure 5C:
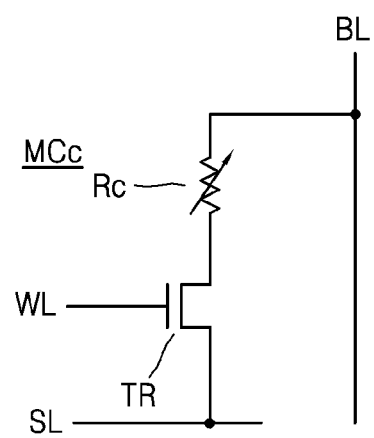

FIGS. 5A through 5C are circuit diagrams of modified examples of a memory cell MC of FIG. 4.

Referring to FIG. 5A, a memory cell MCa includes a variable resistor Ra connected between a bitline BL and a wordline WL. The memory cell MCa stores data due to voltages that are applied to the bitline BL and the wordline WL, respectively.

Referring to FIG. 5B, a memory cell MCb includes a variable resistor Rb and a bidirectional diode Db. The variable resistor Rb includes a resistive material so as to store data. The bidirectional diode Db is connected between the variable resistor Rb and a wordline WL, and the variable resistor Rb is connected between a bitline BL and the bidirectional diode Db. In an alternative configuration, positions of the bidirectional diode Db and the variable resistor Rb may be changed with respect to each other. By using the bidirectional diode Db, leakage current that may flow a non-selected resistor cell may be cut.

Referring to FIG. 5C, a memory cell MCc include a variable resistor Rc and a transistor TR. The transistor TR is a selection device, i.e., a switching device, that supplies or cuts a current to the variable resistor Rc, according to a voltage of a wordline WL. In the embodiment of FIG. 4C, in addition to the wordline WL, a source line SL is additionally arranged to adjust voltage levels at both ends of the variable resistor Rc. The transistor TR is connected between the variable resistor Rc and the source line SL, and the variable resistor R is connected between a bitline BL and the transistor TR. In an alternative configuration, positions of the transistor TR and the variable resistor Rc may be changed with respect to each other. The memory cell MCc is selected or not selected according to the ON or OFF state of the transistor TR that is driven by the wordline WL.

Figure 6:
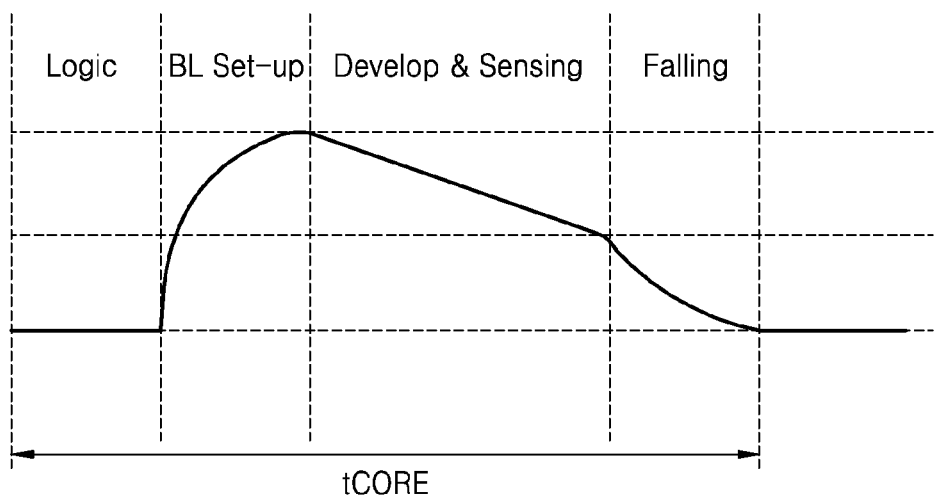
FIG. 6 is a graph that illustrates an example of a waveform of a read operation performed by a resistive memory device.

FIG. 6 is a graph that illustrates an example of a waveform of a read operation performed by a resistive memory device.

As illustrated in FIG. 6, the read operation includes a series of periods, e.g., a logic period, a bitline set-up period, a developing/sensing period, and a falling period. During the logic period, an operation, such as a command and address decoding operation of selecting a memory cell, may be performed. Then, since a set-up operation is performed on a bitline connected to the selected memory cell, the bitline may be precharged to a predetermined level during the bitline set-up period.

During the developing/sensing period, since a current flows to the selected memory cell, a voltage that is applied to a sensing node may be changed, and data that is stored in the selected memory cell may be sensed in the developing/sensing period. Afterward, during the falling period, a voltage of the bitline is discharged. The logic period through the falling period may be repeatedly performed in a next read operation.

As shown in the Table of FIG. 6, the resistive memory device has a shorter read time tCORE for a read operation than other non-volatile memories. For example, the resistive memory device, such as a RRAM or a PRAM, has a read time less than about 1 μs, which is 40 times faster than a flash memory having a read time of about 40 μs. Therefore, the flash memory reads data of relatively many cells during one read time tCORE, whereas the resistive memory device may read data of a relatively small number of cells via multiple read operations.

Figure 7A:
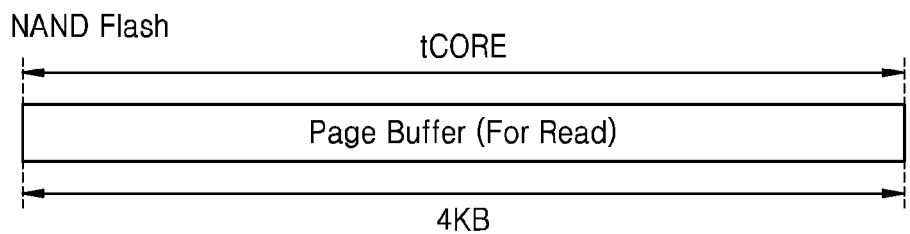
FIGS. 7A through 7C illustrate examples in which read data are stored in a page buffer.
Figure 7B:
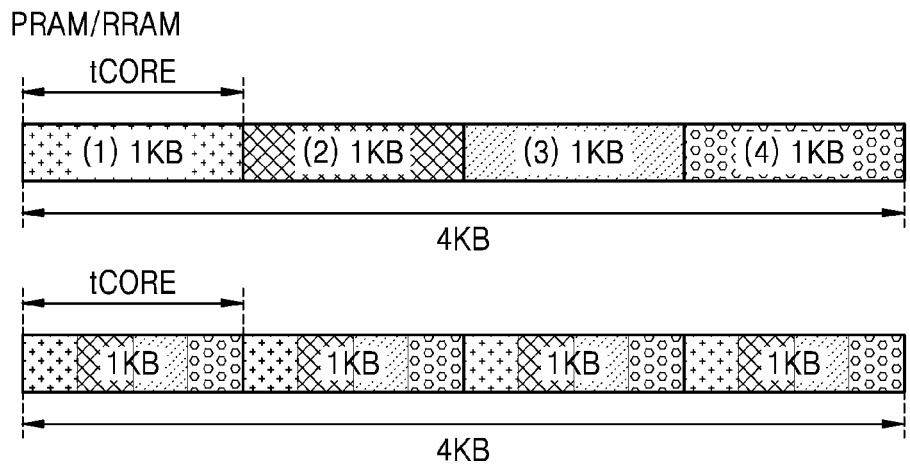
Figure 7C:
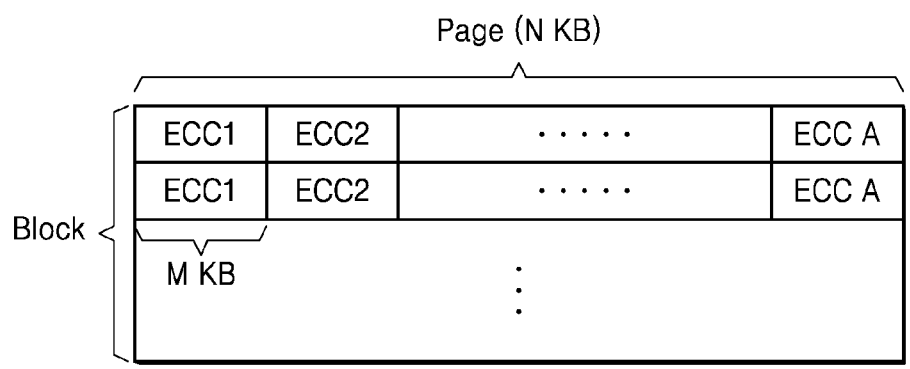

FIGS. 7A through 7C illustrate examples in which read data are stored in a page buffer.

As shown in FIG. 7A, when a required time for one read operation is defined as a read time tCORE, a flash memory reads data of one page corresponding to 4 KB via one read operation, and stores the read data of the page in a page buffer.

In comparison, as shown in FIG. 7B, a resistive memory device such as a RRAM or a PRAM includes one page including multiple cell regions (e.g., four cell regions), and reads data of one cell region via one read operation. For example, data of a cell region that corresponds to 1 KB is read via one read operation, and the read data are stored in a partial storage area of a page buffer. Accordingly, data of four cell regions are read via four read operations. The data that corresponds to 4 KB and is read from the four cell regions may be stored in the page buffer.

Similarly, data that corresponds to 1 KB and are physically remote may be read via one read operation and may be stored in a page buffer. For example, the page buffer may include four regions, each having 1 KB, and data that are read via one read operation may be split and saved in the four regions. Afterward, data that are read via a second read operation may be split and may be saved in the four regions, and by repeatedly doing the read operation, all of data may be stored in the page buffer.

According to the present embodiment, in the example shown in FIG. 7B, four read operations may be performed simultaneously or sequentially. Also, as described in the previous embodiment, multiple pieces of data may be respectively read from four cell regions of a page, based on different read conditions in a read-retry mode, and the multiple pieces of data of the four cell regions that are read based on the different read conditions may be respectively stored in regions of the page buffer. The data stored in the page buffer may be provided to the memory controller 200, and then a data determination operation may be performed to predict a valley of the resistance level distribution.

Figure 8A:
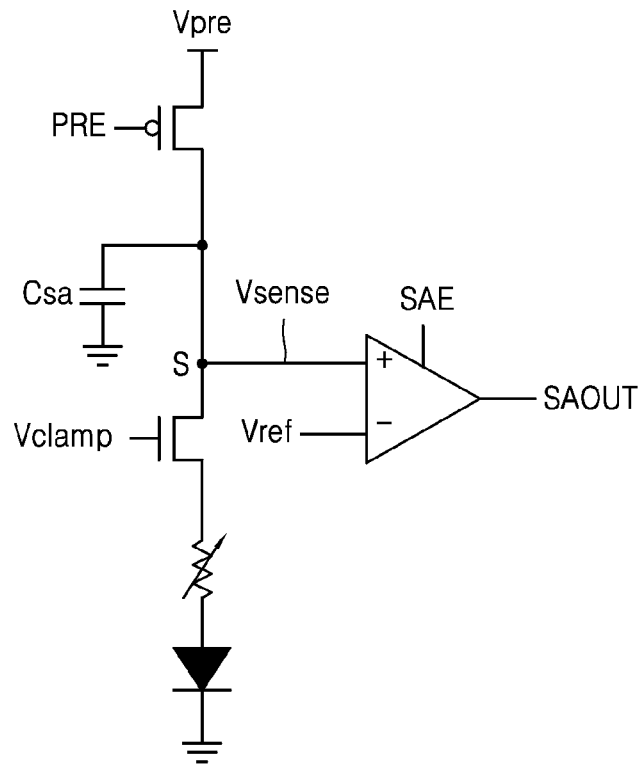
FIGS. 8A and 8B are circuit diagrams illustrating read circuits that are applied to a memory device, according to embodiments of the inventive concept.
Figure 8B:
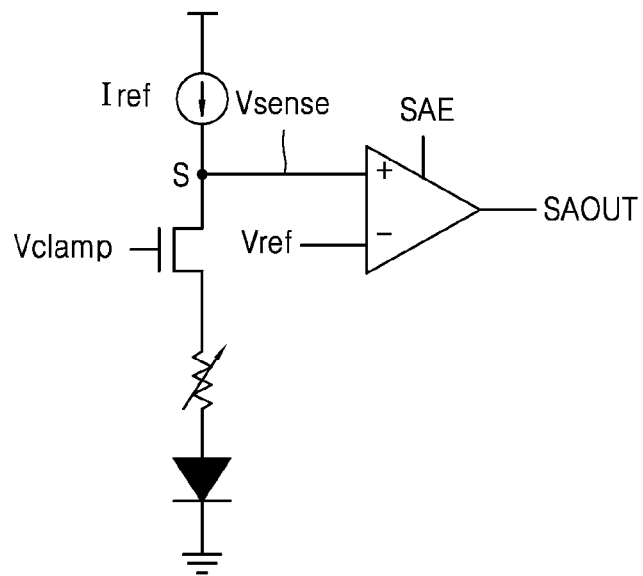

As shown in FIG. 7C, a memory cell array may include multiple memory blocks, and each of the multiple memory blocks may include multiple pages. Also, in the previous embodiment, the cell regions included in one page may be variously defined, e.g., each of the cell regions may correspond to an ECC unit. In the example of FIG. 7C, one page has a size of N KB and includes A cell regions ECC1 through ECC A, and each of the A cell regions ECC1 through ECC A has a size of M KB. That is, each page comprises first through $A^{th}$ cell regions (where A is an integer that is equal to or greater than 2). The page buffer may include storage regions for storing pieces of data from the first through $A^{th}$ cell regions FIGS. 8A and 8B are circuit diagrams illustrating read circuits that are applied to a memory device, according to embodiments of the inventive concept. FIG. 8A illustrates a read circuit that is applied to a voltage sensing method, and FIG. 8B illustrates a read circuit that is applied to a current sensing method.

As shown in FIG. 8A, during a bitline set-up period, a capacitance Csa is precharged by a precharge voltage Vpre. A precharging operation is controlled by a precharge transistor, e.g., while a precharge enable signal PRE is activated. The precharge voltage Vpre is provided to a node of the capacitance Csa via a precharge transistor.

Also, a clamping transistor is disposed to appropriately adjust a voltage of a sensing node S and is controlled in response to a clamping signal Vclamp. For example, a level of a voltage Vsense of the sensing node S may be changed via a clamping operation to a level that is appropriate to be sensed by a comparator. Due to a voltage pre-charged in the capacitance Csa, a current flows via a memory cell, and the level of the voltage Vsense of the sensing node S is gradually decreased due to an amount of charge that is out via a ground terminal. A decreasing speed of the level of the voltage Vsense of the sensing node S varies according to a resistance value of a variable resistor, and according to the result of comparing the level of the voltage Vsense of the sensing node S and a level of a reference voltage Vref at a predetermined point of time, data may be sensed.

For example, when a resistance value of the variable resistor of a memory cell is large, the decreasing speed of the level of the voltage Vsense of the sensing node S has a small value. However, when the resistance value of the variable resistor of the memory cell is small, the decreasing speed of the level of the voltage Vsense of the sensing node S has a large value. Accordingly, when a sensing enable signal SAE is activated, the level of the voltage Vsense of the sensing node S connected to some of memory cells is greater than the level of the reference voltage Vref, whereas the level of the voltage Vsense of the sensing node S connected to others of the memory cells is less than the level of the reference voltage Vref. By performing such sensing operation, the data may be read.

As shown in FIG. 8B, a current source that generates a reference current Iref is arranged, and the reference current Iref is provided to a memory cell via a clamping transistor. The current source that generates the reference current Iref may be embodied in various ways, e.g., the current source may be embodied as a current mirror.

A level of a voltage Vsense of a sensing node S varies according to a resistance value of a variable resistor. According to the result of comparing the level of the voltage Vsense of the sensing node S and a level of a reference voltage Vref, data may be sensed. For example, when a resistance value of the variable resistor of a memory cell is large, the level of the voltage Vsense of the sensing node S has a relatively large value. However, when the resistance value of the variable resistor of the memory cell is small, the level of the voltage Vsense of the sensing node S has a relatively small value. That is, when a sensing enable signal SAE is activated, the level of the voltage Vsense of the sensing node S is compared with the level of the reference voltage Vref, and according to the comparison result, the data may be read.

As shown in FIGS. 8A and 8B, various read conditions may be applied to performing a read operation on the memory cell, e.g., the precharge voltage Vpre, the precharge enable signal PRE, the clamping signal Vclamp, the reference voltage Vref, the reference current Iref, and the sensing enable signal SAE may affect the sensed data. According to the aforementioned previous embodiments, a read condition may be variously changed to analyze a shape of a resistance level distribution of the data, and the variation of the read operation may be achieved by changing at least one of various factors, including the precharge voltage Vpre, the precharge enable signal PRE, the clamping signal Vclamp, the reference voltage Vref, the reference current Iref, and the sensing enable signal SAE. When the data are read using a voltage read method, a valley of a resistance level distribution may be predicted by reading the data while at least one of the factors, including the precharge voltage Vpre, the precharge enable signal PRE, the clamping signal Vclamp, the reference voltage Vref, the reference current Iref, and the sensing enable signal SAE, is changed. Alternatively, when the data are read using a current read method, the valley of the resistance level distribution may be predicted by reading the data while at least one of factors, including the reference current Iref, the clamping signal Vclamp, the reference voltage Vref, and the sensing enable signal SAE, is changed.

Figure 9:
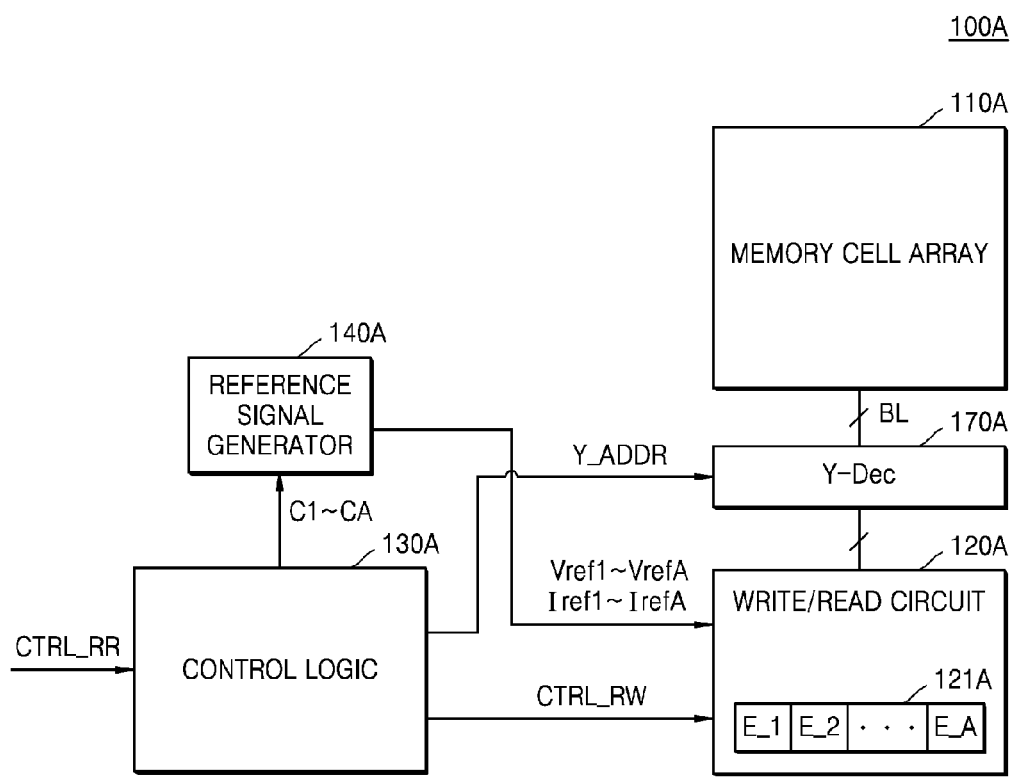
FIG. 9 is a block diagram of a memory device that performs a read-retry operation, according to another embodiment of the inventive concept.

FIG. 9 is a block diagram of a memory device 200 that performs a read-retry operation, according to another embodiment of the inventive concept. As illustrated in FIG. 9, the memory device 100A includes a memory cell array 110A, a write/read circuit 120A, a column decoder 170A, a control logic 130A, and a reference signal generator 140A. Also, the write/read circuit 120A includes a page buffer 121A that includes A storage regions E_1 through E_A for storing multiple pieces of data of A cell regions. Also, as described in the previous embodiment, the reference signal generator 140A may be arranged in the write/read circuit 120A. Also, other function blocks shown in FIG. 2 or other additional function blocks may be further arranged in the memory device 100A of FIG. 9, but are not illustrated here.

The control logic 130A may receive, from a memory controller (not shown), control information CTRL_RR related to various operations to be performed in a read-retry mode. The control information CTRL_RR may include multiple pieces of information related to read references, and the control logic 130A may set multiple read conditions, based on the pieces of information related to the read references. Also, the control logic 130A may generate, based on the control information CTRL_RR, various internal control signals that are required for the read-retry operation. For example, when one page includes the A cell regions, in order to set different read conditions in the A cell regions, respectively, the control logic 130A may provide the reference signal generator 140A with control signals C1 through CA for adjusting a level of a reference signal. The reference signal generator 140A may provide the write/read circuit 120A with reference voltages Vref1 through VrefA and/or reference currents Iref1 through IrefA that correspond to the A cell regions, respectively, and have different levels.

Similarly, a write/read control signal CTRL_RW for a simultaneous read or a sequential read on cell regions included one page may be provided to the write/read circuit 120A. For selection according to the cell regions, a column address Y_ADDR may be provided to the column decoder 170A. In response to control performed by the control logic 130A, general conditions for a re-read operation may be set. In the embodiment of FIG. 9, the levels of the reference voltages Vref1 through VrefA and/or the levels of the reference currents Iref1 through IrefA are adjusted by differing the read conditions, but the read conditions may be differently set by varying factors other than the aforementioned factors.

Figure 10:
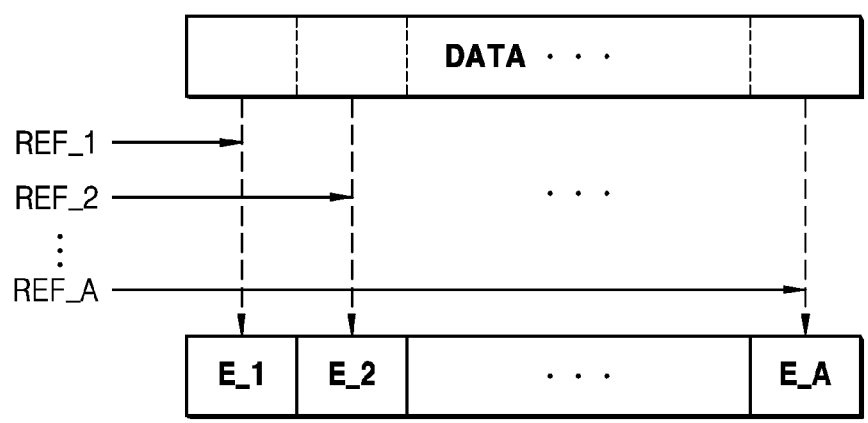
FIG. 10 illustrates an example in which data of a page is read during a read-retry mode.

FIG. 10 illustrates an example in which data of a page is read during a read-retry mode, according to an embodiment of the inventive concept.

As illustrated in FIG. 10, data DATA that are stored in the page of a memory cell array may be read by a cell region unit, using different read conditions. When first through $A^{th}$ read conditions are defined as REF_1 through REF_A, respectively, the A cell regions of the page may be simultaneously read and may be stored in the A storage regions E_1 through E_A of a page buffer.

For example, data of the first cell region may be read according to the first read condition REF_1 and stored in the first storage region E_1 of the page buffer, and simultaneously, data of the second cell region may be read according to the second read condition REF_2 and stored in the second storage region E_2 of the page buffer. Similarly, data of the $A^{th}$ cell region may be simultaneously read according to the $A^{th}$ read condition REF_A and stored in the $A^{th}$ storage region E_A of the page buffer.

Figure 11A:
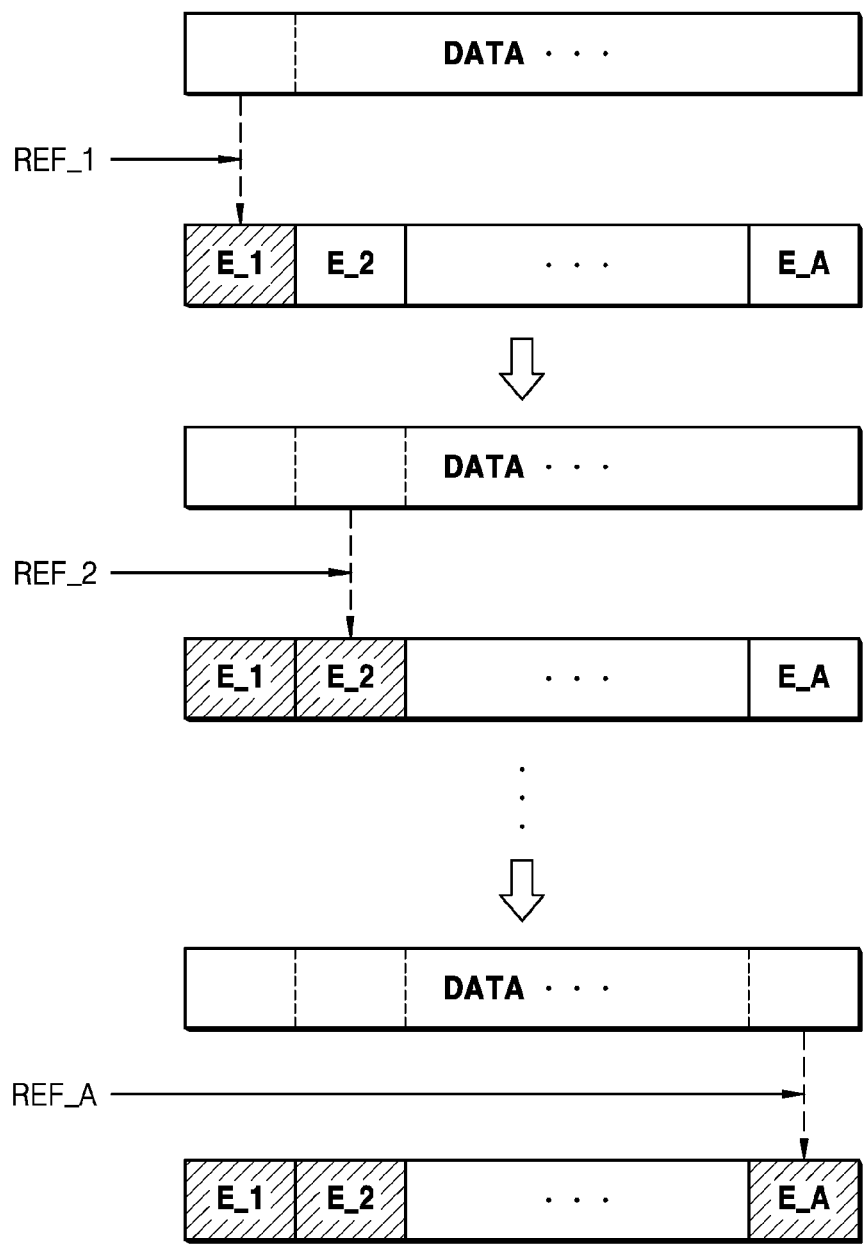
FIGS. 11A and 11B illustrate other examples in which data of a page is read during a read-retry mode.
Figure 11B:
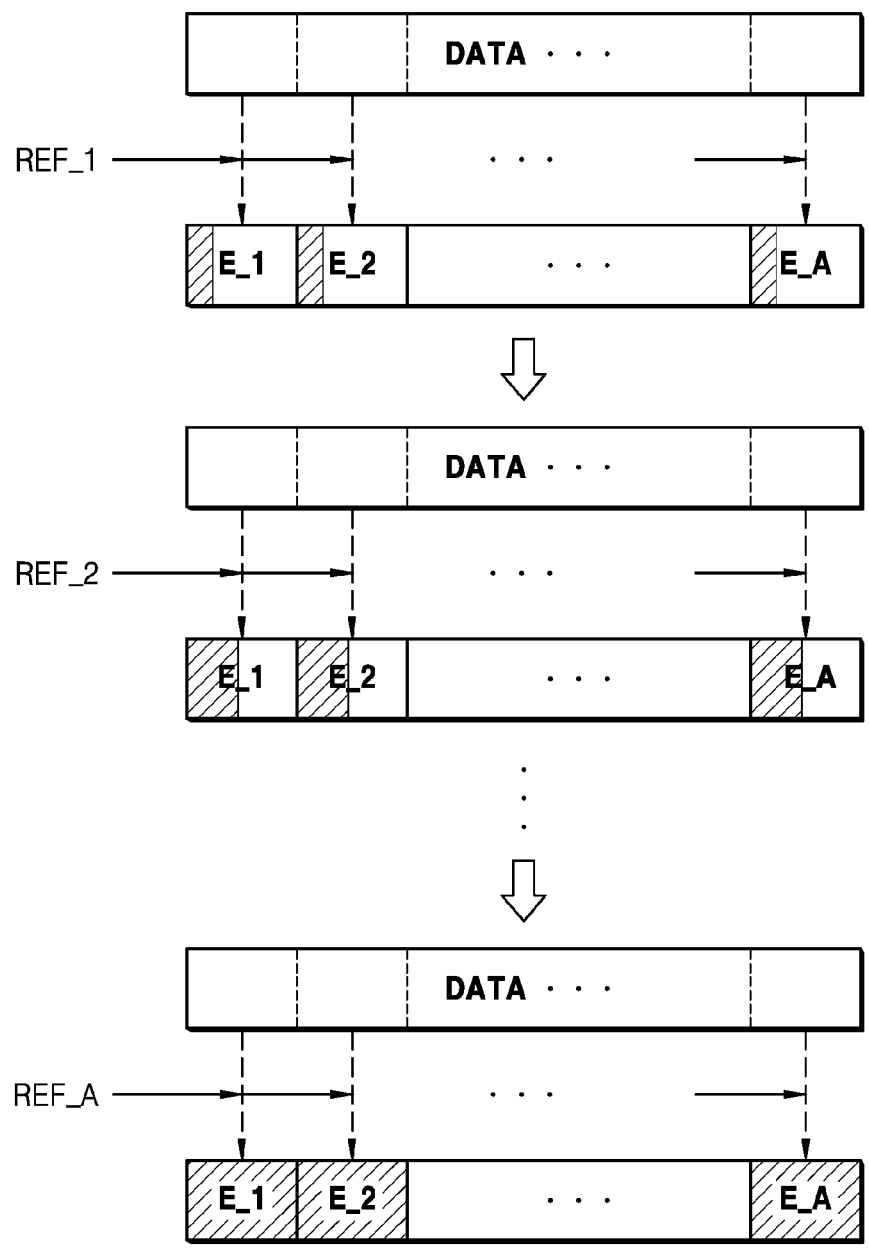

FIGS. 11A and 11B illustrate other examples in which data of a page are read during a read-retry mode. In the examples of FIGS. 11A and 11B, the data of the page are sequentially read. Referring to FIG. 11A, the data of the page of a memory cell array are read by a cell region unit, and referring to FIG. 11B, multiple pieces of data of the page of the memory cell array are simultaneously read from cell regions.

As illustrated in FIG. 11A, a first cell region of the page may be read according to a first read condition REF_1 and stored in a first storage region E_1 of a page buffer, and then a second cell region of the page may be read according to a second read condition REF_2 and stored in a second storage region E_2 of the page buffer. The data are sequentially read in a similar manner, and finally, an $A^{th}$ cell region of the page may be read according to an $A^{th}$ read condition REF_A and may be stored in an $A^{th}$ storage region E_A of the page buffer.

As illustrated in FIG. 11B, the multiple pieces of data of the page may be simultaneously read from the cell regions according to a first read condition REF_1. For example, data may be partially read from each of A cell regions according to the first read condition REF_1, and multiple pieces of the data that were partially read according to the first read condition REF_1 may be stored in portions of first through $A^{th}$ storage regions E_1 through E_A, respectively, according to the first read condition REF_1.

Afterward, multiple pieces of data of the page may be simultaneously and partially read from the A cell regions according to a second read condition REF_2, and the multiple pieces of data of the page that were partially read from the A cell regions according to the second read condition REF_2 may be stored in other portions of the first through $A^{th}$ storage regions E_1 through E_A, respectively, according to the second read condition REF_2. By doing so, multiple pieces of data that are read according to the $A^{th}$ read condition REF_A may be stored in other portions of the first through $A^{th}$ storage regions E_1 through E_A, respectively.

As illustrated in FIG. 11B, the data stored in the page buffer may be provided to a memory controller. The memory controller may perform a data analysis operation on data that was read based on as a same read condition, and may predict a valley of a resistance level distribution. That is, the memory controller may receive the multiple pieces of data of the first through $A^{th}$ storage regions E_1 through E_A of the page buffer, form a data unit by combining the pieces of data of the portions of the first through $A^{th}$ storage regions E_1 through E_A, and perform the data analysis operation on the data unit.

Figure 12A:
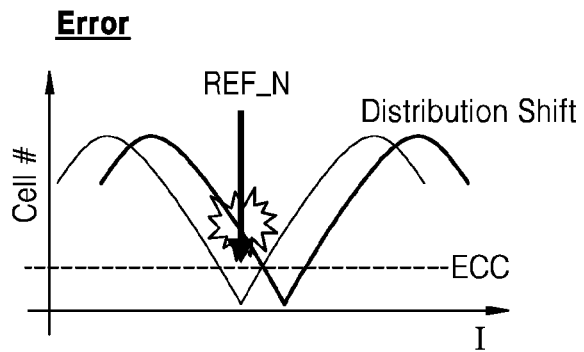
FIGS. 12A through 12C are graphs illustrating examples in which a valley of a resistance level distribution is predicted, according to embodiments of the inventive concept.
Figure 12B:
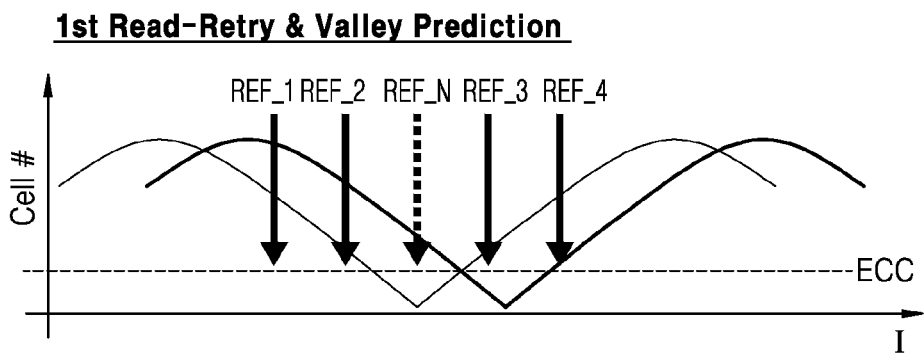
Figure 12C:
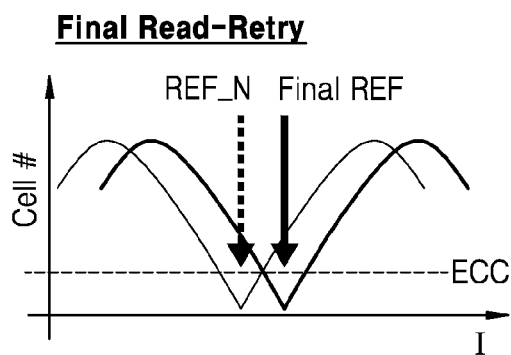

FIGS. 12A through 12C are graphs illustrating examples in which a valley of a resistance level distribution is predicted, according to embodiments of the inventive concept. In FIGS. 12A through 12C, the horizontal axis indicates current value, and the vertical axis indicates the number of memory cells. Thus, the distribution to the left in a resistance level distribution indicates a distribution of memory cells that have relatively large resistance values, and the distribution to the right in the resistance level distribution indicates a distribution of memory cells that have relatively small resistance values. Although not illustrated, in the graphs of FIGS. 12A through 12C, the horizontal axis may indicate a resistance, and if so, the distribution to the right indicates the distribution of the memory cells that have relatively large resistance values, and the distribution to the left indicates the distribution of the memory cells that have relatively small resistance values.

When data are read based on a predetermined read condition, the read condition may correspond to a reference resistance value for reading the data. For example, when it is set that the data are read based on a first reference resistance value according to a first read condition, the data may be read according to whether variable resistance values of memory cells are larger or smaller than the first reference resistance value. According to a second read condition that is different from the first read condition, the data may be read based on a second reference resistance value that is different from the first reference resistance value. That is, the reference resistance value for reading the data may be changed by varying at least one of the various factors including a clamping voltage, a precharge voltage, a reference voltage, a reference current, and a sensing enable time, as discussed above. In order to minimize occurrence of errors of the data in a read-retry mode, the reference resistance value that corresponds to the predetermined read condition has to maximally approach the valley of the resistance level distribution.

As illustrated in FIG. 12A, the resistance level distribution of the memory cells may be shifted due to various factors, such as an elapse of time or interference caused by access to other memory cells. In order to correctly sense the data, the read condition has to be set to correspond to the valley of the resistance level distribution the memory cells. But, when the resistance level distribution of the memory cells has been shifted, a preset normal read condition REF_N in a normal read operation does not correspond to the valley of the shifted resistance level distribution. In the example of FIG. 12A, when an uncorrectable error is detected by an ECC operation on data that is read by using the preset normal read condition REF_N, a read-retry mode as shown in FIGS. 12A and 12B may be performed.

As illustrated in FIG. 12B, a read-retry operation may include multiple re-read loops. In a first re-read loop, an operation of predicting the valley of a resistance level distribution may be performed and, as stated in the previous embodiment, one page may include multiple cell regions and a re-read operation may be performed on each of the cell regions using different read conditions. For example, when one page includes four cell regions, four read conditions REF_1 through REF_4 may be set for a re-read operation, and multiple pieces of the four cell regions are read, respectively, using the four read conditions REF_1 through REF_4.

A data determination operation may be performed on the read data of each of the four cell regions, and the valley of the resistance level distribution may be predicted based on the data determination operation. In the example of FIG. 12B, the third read condition REF_3 corresponds to the valley of the shifted resistance level distribution, thus, only the number of errors that are correctable by an ECC operation occur in the data read using the third read condition REF_3. That is, a read condition that corresponds to the valley of the resistance level distribution may be searched for using one re-read loop, without the need to repeatedly perform a re-read loop while the read condition is changed, so that the time required for the read-retry operation decreases.

When the valley of the resistance level distribution is predicted in the aforementioned manner, a read condition (e.g., the third read condition REF_3) corresponding to the predicted valley is set as a final read condition Final REF. That is, as illustrated in FIG. 12C, a read operation may be performed on a page using the final read condition Final REF in the next read-retry loop. That is, data may be read by commonly applying, to the cell regions, the third read condition REF_3 that corresponds to the predicted valley of the resistance level distribution. With respect to the data read based on the final read condition Final REF, only correctable errors may occur, or no errors may occur, so that the data that is read based on the final read condition Final REF may be used as the data that corresponds to a read command.

In the examples of FIGS. 12A through 12C, the read condition that corresponds to the valley of the resistance level distribution was found via one re-read loop, but one or more embodiments of the inventive concept are not limited thereto. For example, when the read condition that corresponds to the valley of the resistance level distribution is not found via one re-read loop, a read condition (hereinafter, a changed read condition) having a different or changed factor from the read condition of the previous loop is set in a next re-read loop. Data are read based on the changed read condition, and the valley of the resistance level distribution may be predicted by performing a determination operation on the data. The changed read condition may be set as four different changed read conditions for the four cell regions, for example. When the valley of the resistance level distribution is predicted via the aforementioned procedure, the changed read condition that corresponds to the predicted valley of the resistance level distribution may be set as the final read condition for the example of FIG. 12C.

Figure 13:
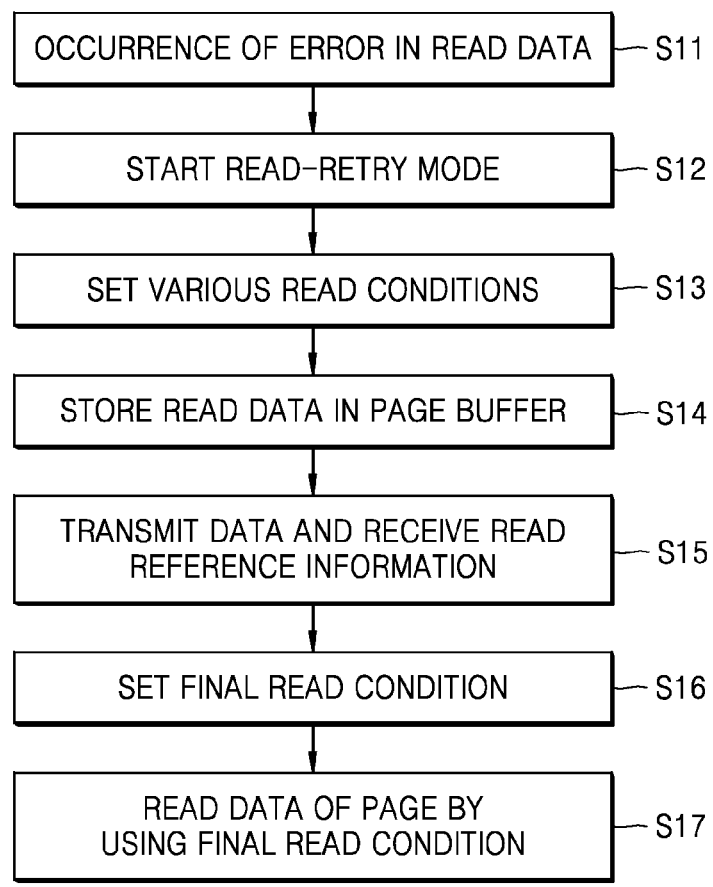
FIG. 13 is a flowchart of an operating method of a memory device, according to an embodiment of the inventive concept.

FIG. 13 is a flowchart of a method of operating a memory device, according to an embodiment of the inventive concept.

As illustrated in FIG. 13, the memory device performs a read operation using a normal read condition, in response to a read command and an address from a memory controller, and provides read data to a memory controller. According to the address, data that corresponds to one page may be read, and the memory controller performs an error detection operation on the read data. A resistance level distribution of memory cells of the page may be shifted due to various factors, such as an elapse of time or interference caused by a memory operation on other memory cells, such that an error occurs in the read data (S11).

According to the result of the error detection operation performed by the memory controller, it is determined whether the error may be corrected by performing an ECC operation. When an error that is not correctable by the ECC operation has occurred, the memory device is controlled by the memory controller so as to operate in a read-retry mode.

The memory device therefore enters the read-retry mode (S12). The memory controller provides the memory device with read reference information indicating multiple read conditions to be used in a read-retry operation, as well as a signal that indicates a start of the read-retry mode. As stated above, one page may include multiple cell regions, and multiple pieces of data of the cell regions may be read according to different read conditions during the read-retry mode.

The memory device sets various read conditions, based on the read reference information from the memory controller (S13). According to the set read conditions, data of each of the cell regions is read. For example, A different read conditions are set for A cell regions, and multiple pieces of data that are read according to the A different read conditions are stored in a page buffer (S14). The memory device provides the memory controller with the data stored in the page buffer and receives, from the memory controller, read reference information that is based on a resistance level distribution obtained by analyzing the data of each of the A cell regions (S15). The memory device sets a final read condition, based on the read reference information (S16), and reads data of a page using the set final read condition (S17).

Figure 14:
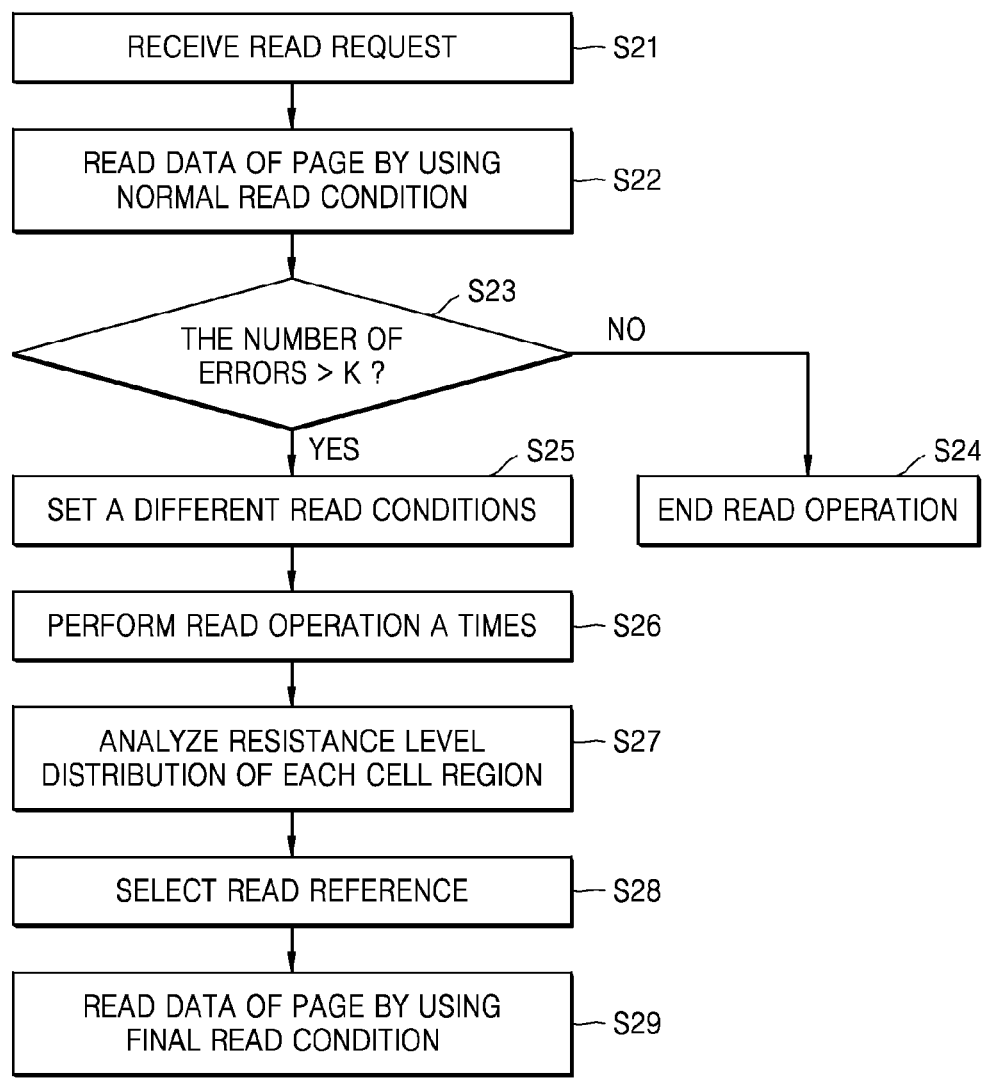
FIG. 14 is a flowchart of an operating method of a memory system, according to an embodiment of the inventive concept.

FIG. 14 is a flowchart of a method of operating a memory system, according to an embodiment of the inventive concept. The memory system includes a memory controller and a memory device.

The memory system receives a read request with respect to data from a host (S21), and in response to the read request, reads data of a page using a normal read condition (S22). A data read unit for the memory device, and a data exchange unit for the memory device and the memory controller are variously set. For example, multiple pieces of data of portions of a page may be sequentially read and stored in a page buffer, and when all data are stored in the page buffer, the stored data may be provided from the memory device to the memory controller. Alternatively, the data may be read by a page unit, thus, data read via one read operation may be stored in the page buffer, and the stored data may be provided from the memory device to the memory controller.

The memory controller performs an error detection operation on the data read using the normal read condition. As a result of the error detection operation, the memory controller determines whether the number of errors is greater than a predetermined threshold value K. When the number of errors is equal to or less than the threshold value K, the memory controller does not separately perform a read-retry mode, but ends the read operation (S24).

However, when the number of errors is greater than the threshold value K, the memory controller provides the memory device with a mode signal indicating the start of the read-retry mode, and reads reference information for setting read conditions that respectively correspond to A cell regions of one page. The memory device sets A different read conditions, based on the read reference information (S25), and performs a read operation A times on the page, according to the set A different read conditions (S26). As described above, the read operation may be simultaneously or sequentially performed A times. Multiple pieces of data of the A cell regions that are read using the A different read conditions are stored in a page buffer, and are then provided to the memory controller. The memory controller analyzes a resistance level distribution of each of the A cell regions (S27), and according to an analysis result of the resistance level distribution, selects a read reference that corresponds to a valley of a resistance level distribution of each of the A cell regions (S28).

Since the resistance level distribution is analyzed on each of the pieces of data that were read using the A different read conditions, some data read using at least one read condition from among the A different read conditions may have errors, the number of which is equal to or less than the threshold value K, so that the errors of the data may be corrected by performing an ECC operation thereon. The at least one read condition from among the A different read conditions that makes the number of occurred errors be equal to or less than the threshold value K is set as the final read condition. For example, a read condition that results in occurrence of the minimum number of errors is set as the final read condition. Afterward, data of the page are read using the final read condition (S29), and the data read using the final read condition are used as the data that corresponds to the read request.

Figure 15:
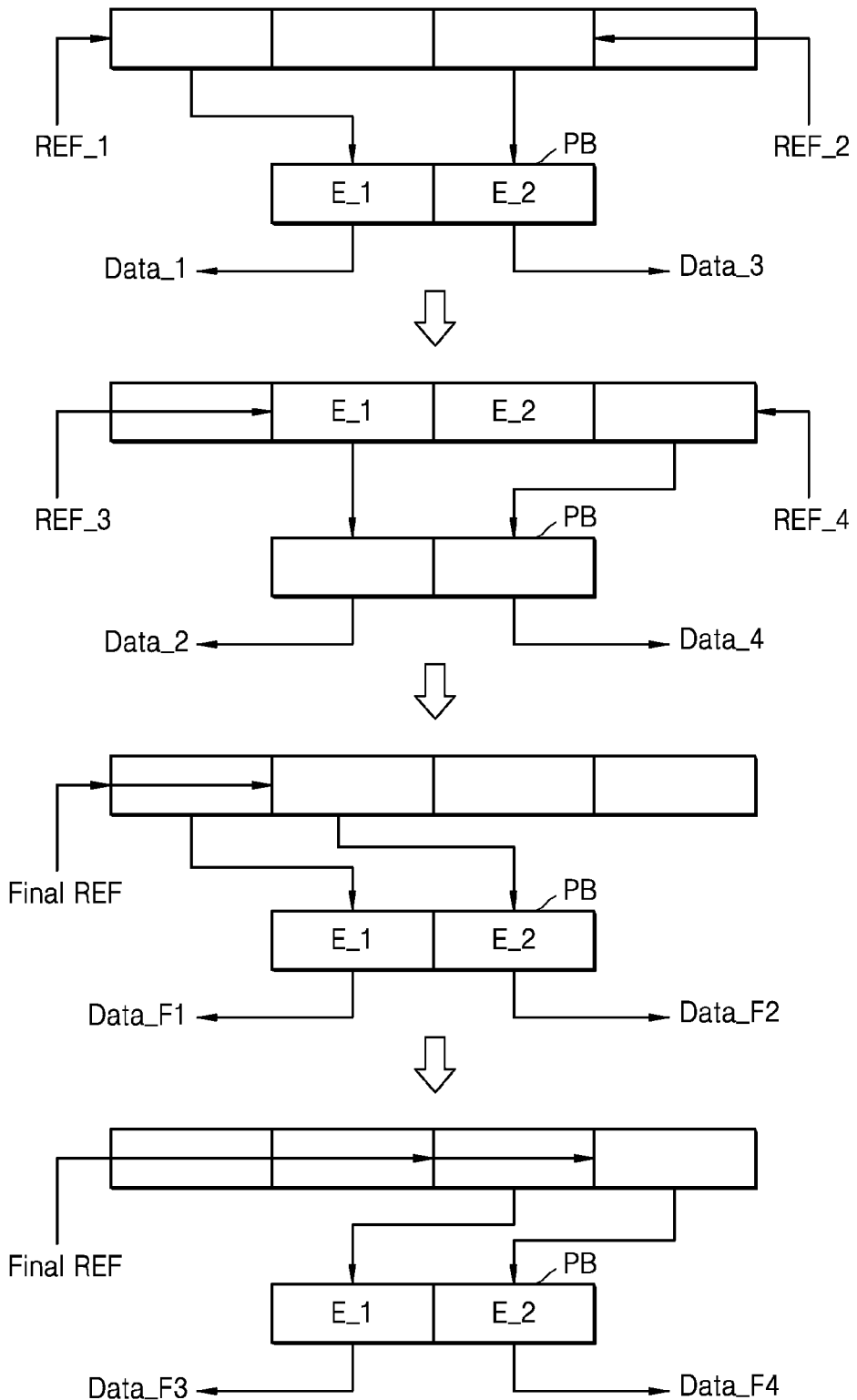
FIG. 15 is a block diagram illustrating operations of a memory device, according to another embodiment of the inventive concept.

FIG. 15 is a block diagram illustrating operations of a memory device, according to another embodiment of the inventive concept. In the embodiment of FIG. 15, the size of the page buffer is smaller than the size of the page defined in a memory cell array.

As illustrated in FIG. 15, one re-read loop may be defined in a manner that data of at least two cell regions included in one page is read using different read conditions. The read data are stored in a page buffer PB, and the data stored in the page buffer PB are provided to a memory controller. According to the embodiment of FIG. 15, at least two re-read loops may be performed, and the memory controller may perform a data determination operation on data that was read via the at least two re-read loops. According to the result of the data determination operation, a valley of the resistance level distribution is predicted, a read condition that corresponds to the valley of the resistance level distribution is set as the final read condition, and then multiple pieces of data of cell regions of the page are read using the final read condition.

In the embodiment of FIG. 15, the size of the page corresponds to 8 KB, the size of the page buffer PB corresponds to 4 KB, and the size of each of the cell regions of the page corresponds to 2 KB. In the first re-read loop, data Data_1 of a first cell region are read according to a first read condition REF_1 and stored in a first storage region E_1 of the page buffer PB, and data Data_3 of a third cell region are read according to a second read condition REF_2 and stored in a second storage region E_2 of the page buffer PB. Re-read operations that use the first read condition REF_1 and the second read condition REF_2 may be simultaneously performed, and the data Data_1 of the first cell region and the data Data_3 of the third cell region of the page may be provided to the memory controller.

In the second re-read loop, data Data_2 of a second cell region that are read according to a third read condition REF_3 and data Data_4 of a fourth cell region that are read according to a fourth read condition REF_4 are stored, respectively, in the first storage region E_1 and the second storage region E_2 of the page buffer PB.

The memory controller may perform a data determination operation on the data Data_1 through the data Data_4 of the four cell regions of the page. Based on the result of the data determination operation, the memory controller provides the memory device with read reference information for setting the final read condition Final_REF. The memory device reads data using the final read condition Final_REF, and provides the memory controller with the data Data_1 through data Data_4 read using the final read condition Final_REF.

FIGS. 16A through 18B illustrate various examples of varying a read condition, according to embodiments of the inventive concept. Graphs shown in FIGS. 16A through 18B are described below with reference to the read circuit of FIG. 8.

Figure 16A:
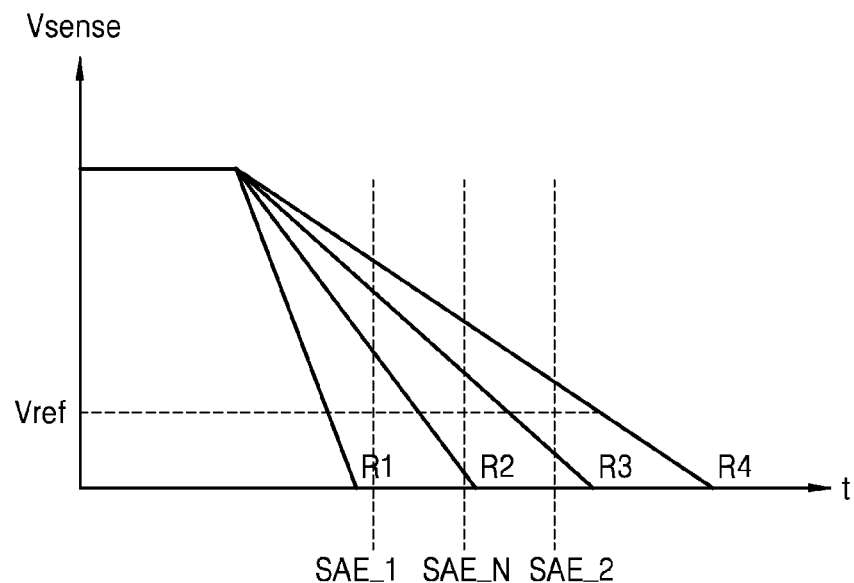
FIGS. 16A through 18B illustrate various examples of varying a read condition, according to embodiments of the inventive concept.
Figure 16B:
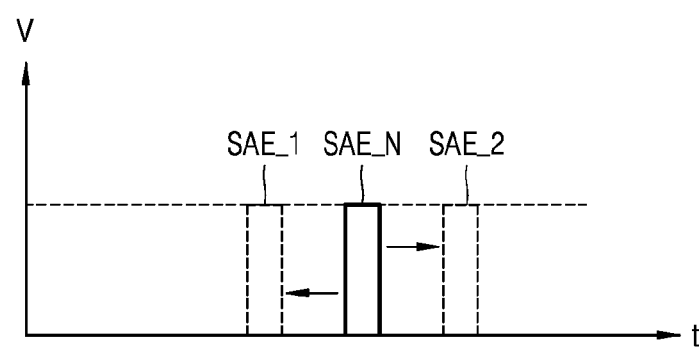

FIGS. 16A and 16B illustrate an example in which the read condition is changed by adjusting the point of time at which a sensing enable signal SAE is activated. As illustrated in FIG. 16A, according to resistance states R1 through R4 of memory cells, a decreasing speed of the level of the voltage Vsense of the sensing node S may vary, and multiple pieces of data of the memory cells may be differently read in response to the sensing enable signal SAE for controlling the sensing point of time of a comparator. For example, according to a sensing enable signal SAE_N used in a normal read condition, at a predetermined point of time, the level of the voltage Vsense of the sensing node S of the memory cells having the third resistance state R3 and the fourth resistance state R4 may be larger than the reference voltage Vref, whereas the level of the voltage Vsense of the sensing node S of the memory cells having the first resistance state R1 and the second resistance state R2 may be lower than the reference voltage Vref. On the other hand, according to a sensing enable signal SAE_1 used in a first read condition, the level of the voltage Vsense of the sensing node S of the memory cells having the second resistance state R2 may be larger than the reference voltage Vref. Also, according to a sensing enable signal SAE_2 used in a second read condition, the level of the voltage Vsense of the sensing node S of the memory cells having the third resistance state R3 may be lower than the reference voltage Vref.

In the present embodiment, when a first cell region included in a page is read using a first read condition and a second cell region included in the page is read using a second read condition, as illustrated in FIG. 16B, the activation time of the sensing enable signal SAE_1 in the first read condition may be different from the activation time of the sensing enable signal SAE_2 in the second read condition. Even when the resistance level distribution of memory cells is shifted, data are re-read by varying the activation time of the sensing enable signal and is determined, so that the activation time of the sensing enable signal at which error occurrence is minimized may be searched for.

Figure 17A:
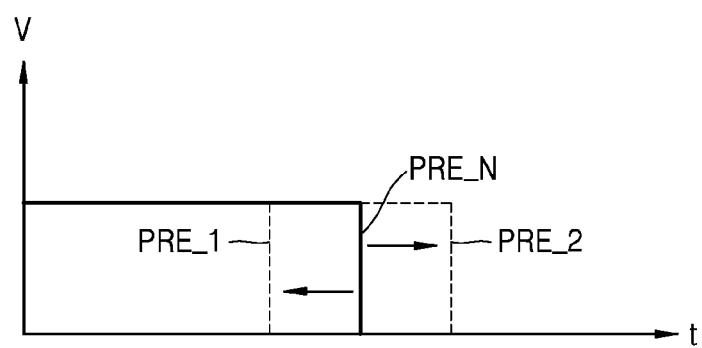
Figure 17B:
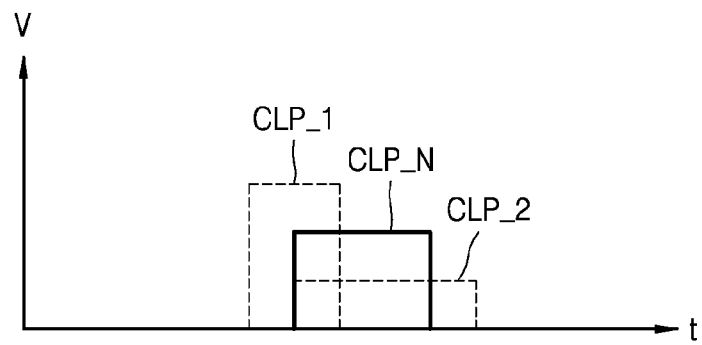

FIGS. 17A and 17B illustrate an example in which the read condition is changed by varying the precharge enable signal PRE or the clamping signal Vclamp. As illustrated in FIG. 17A, the read condition may be changed by differing in periods in which the precharge enable signal PRE is activated. For example, a period PRE_N in which the precharge enable signal PRE is activated during a normal operation mode, a period PRE_1 in which the precharge enable signal PRE is activated during a read-retry mode, and a period PRE_2 in which the precharge enable signal PRE that corresponds to a second read condition is activated during the read-retry mode are set to be different from each other. Since the activation periods of the precharge enable signal PRE are different from each other, the amount of charges that are charged in the capacitance Csa may vary, so that a level of the precharge voltage Vpre that is applied to the sensing node S may vary.

Alternatively, as illustrated in FIG. 17B, the read condition may be changed by adjusting the level and the width of a clamping signal CLP. For example, the level and/or the width of a clamping signal CLP_N during a normal operation mode may be different from the level and/or the width of a clamping signal CLP_1 that corresponds to a first read operation during a read-retry mode and the level and/or the width of a clamping signal CLP_2 that corresponds to a second read operation during the read-retry mode. By adjusting the level and the width of the clamping signal CLP, the level of voltage that is applied to the sensing node S may vary.

Figure 18A:
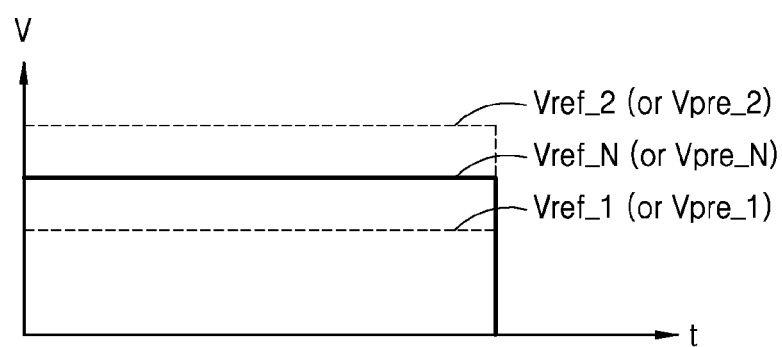
Figure 18B:
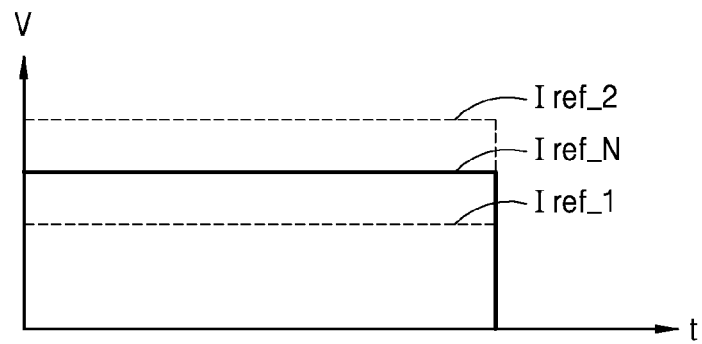

FIGS. 18A and 18B illustrate examples in which the read condition is changed by varying the level of the reference voltage Vref, the level of the reference current Iref, or the level of the precharge voltage Vpre. As illustrated in FIG. 18A, the level of the reference voltage Vref or the level of the precharge voltage Vpre in a normal operation mode may be different from the level of the reference voltage Vref or the level of the precharge voltage Vpre that corresponds to a read condition in a read-retry mode. In the example of FIG. 18A, the level of the reference voltage Vref or the precharge voltage Vpre that corresponds to a first read condition is lower than the level of the reference voltage Vref or the precharge voltage Vpre in the normal operation mode, and the level of the reference voltage Vref or the precharge voltage Vpre that corresponds to a second read condition is higher than the level of the reference voltage Vref or the precharge voltage Vpre in the normal operation mode. Similarly, in the example of FIG. 18B, the level of the reference current Iref that corresponds to a first read condition is lower than the level of the reference current Iref in the normal operation mode, and the level of the reference current Iref that corresponds to a second read condition is higher than the level of the reference current Iref in the normal operation mode.

Figure 19:
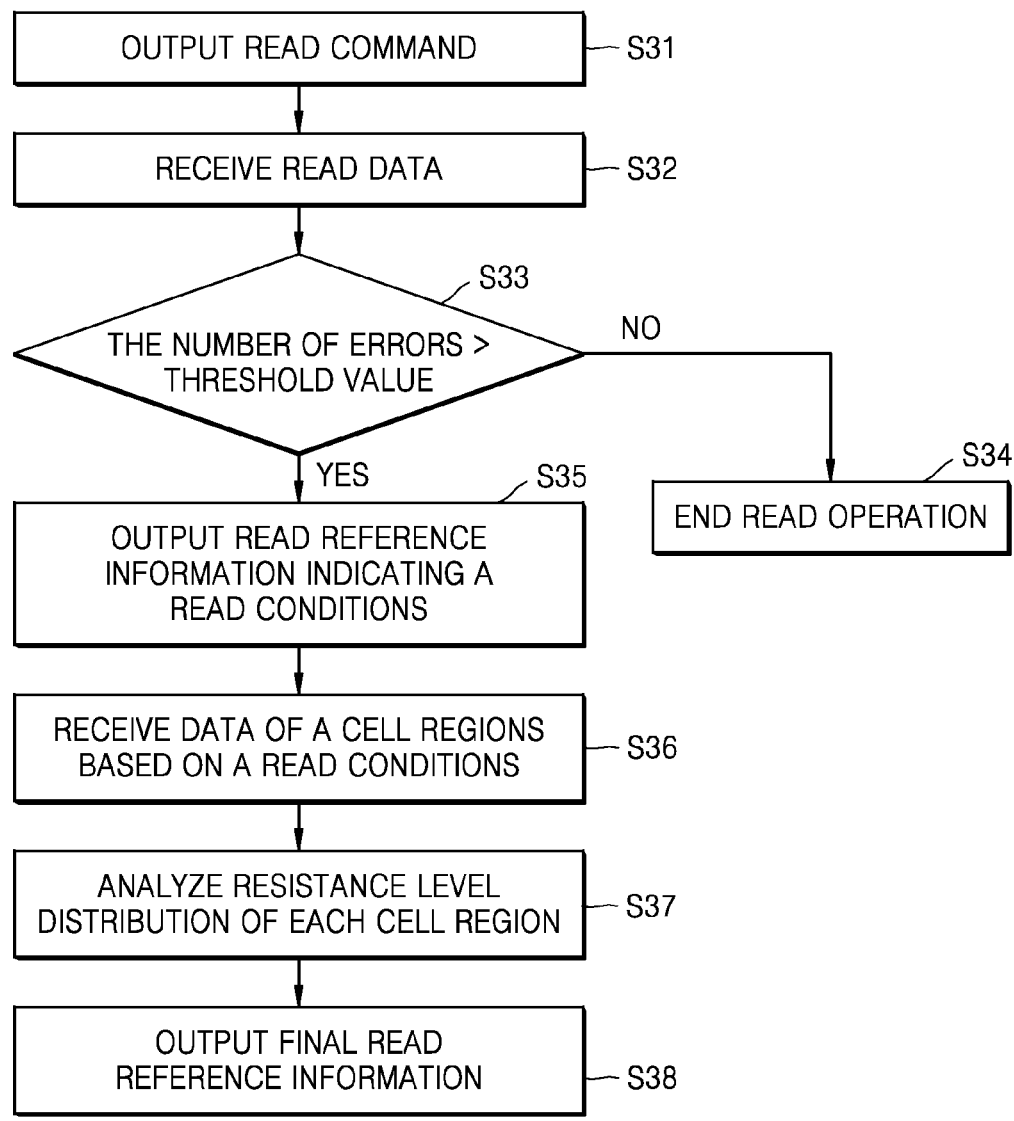
FIG. 19 is a flowchart of an operating method of a memory system, according to another embodiment of the inventive concept.

FIG. 19 is a flowchart of a method of operating a memory system, according to another embodiment of the inventive concept. In the embodiment of FIG. 19, the memory system includes a memory controller, and the embodiment of FIG. 19 is described with respect to operation of the memory controller during the operating method of the memory system.

In response to a request from a host, the memory controller controls a read operation with respect to a memory device, and to do so, the memory controller outputs a read command to the memory device (S31). An address for indicating memory cells to be read, as well as the read command, may be output to the memory device, and a page of the memory device may be selected based on the address.

The memory controller receives read data from the memory device (S32), performs an error detection operation on the read data, and thus determines whether the number of errors is greater than a predetermined threshold value (S33). When the number of errors is less than the predetermined threshold value, the read operation on the address is ended (S34).

As a result of the determination, when the number of errors is greater than the predetermined threshold value, the memory controller control a start of a read-retry mode for analyzing a resistance level distribution of memory cells based on a data determination operation and predicting a valley of the resistance level distribution. Also, the memory controller generates read reference information indicating A read conditions so as to control data to be read, based on the A read conditions that are different from each other, from cell regions of a page that corresponds to the address, and outputs the read reference information to the memory device (S35). The memory device sets the A read conditions that correspond to the read reference information, and performs a read operation on A cell regions using the A different read conditions. Then, the memory controller receives read data of the A cell regions (S36). The memory controller analyzes a resistance level distribution of each of the A cell regions (S37), and outputs, to the memory device, information about a final read condition that corresponds to the valley of the resistance level distribution (S38).

Figure 20:
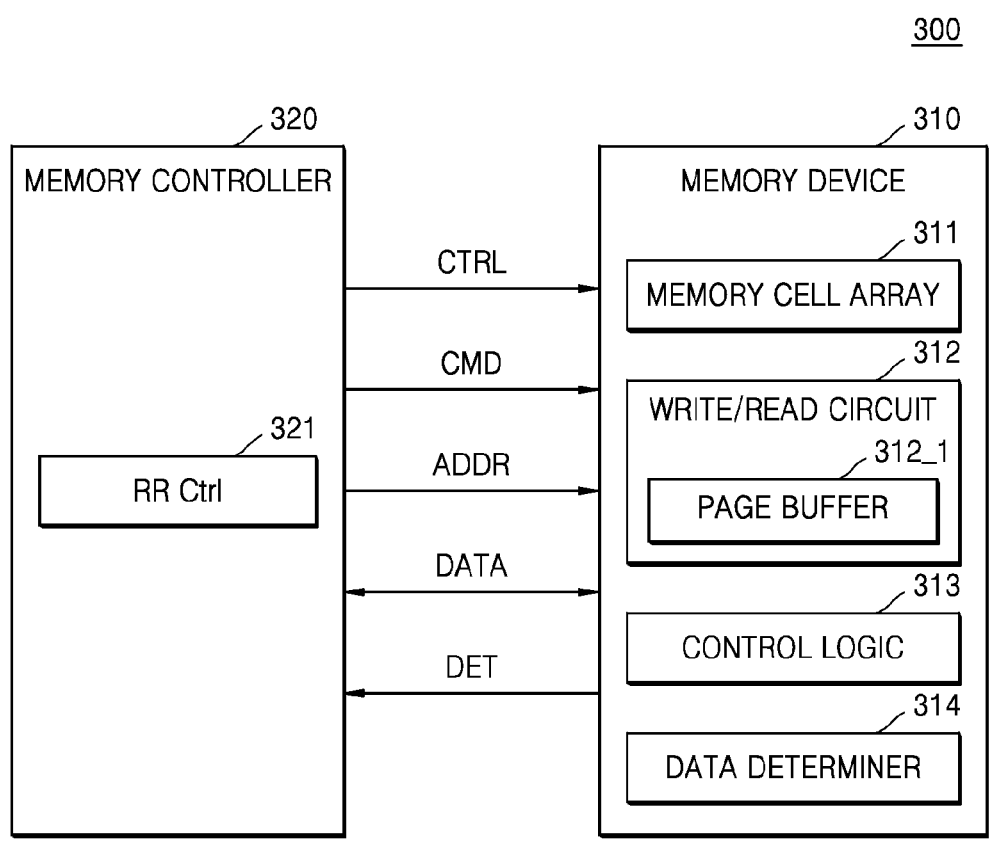
FIG. 20 is a block diagram of a memory system, according to another embodiment of the inventive concept.

FIG. 20 is a block diagram of a memory system 300, according to another embodiment of the inventive concept.

Referring to FIG. 20, the memory system 300 includes a memory device 310 and a memory controller 320. The memory device 310 includes a memory cell array 311, a write/read circuit 312, and control logic 313. Also, the write/read circuit 312 includes a page buffer 312_1. In the present embodiment, the memory device 310 further includes a data determiner 314. Also, the memory controller 320 includes a read-retry controller 321.

According to the embodiment of FIG. 20, in a read-retry mode, a data determination operation on read data is performed by the memory device 310. For example, when an uncorrectable error occurs from data that was read according to a normal read operation, the memory device 310 starts the read-retry mode, under control of the read-retry controller 321. In the read-retry mode, as described in the previous embodiment, multiple pieces of data of cell regions of one page may be read based on different read conditions, respectively, and the data determiner 314 performs a data determination operation on the read data so as to analyze a resistance level distribution and to predict a valley. The result of the data determination operation DET is provided to the memory controller 320, and the memory controller 320 controls general operations during the read-retry mode, based on the result of the data determination operation DET.

Figure 21:
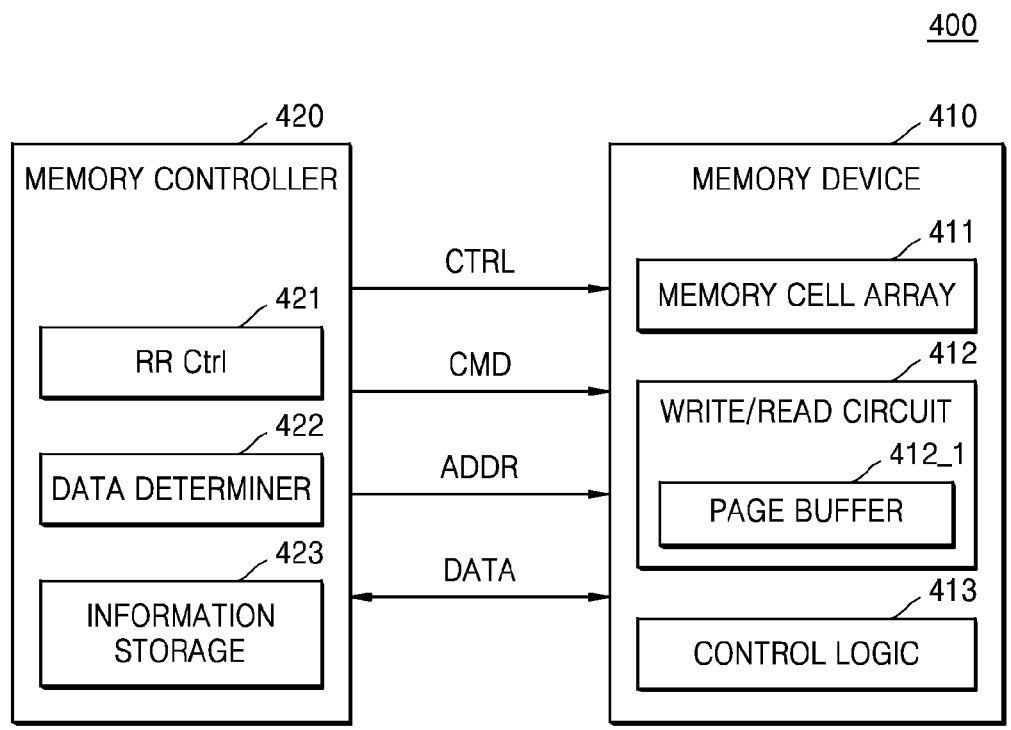
FIG. 21 is a block diagram of a memory system, according to another embodiment of the inventive concept.

FIG. 21 is a block diagram of a memory system 400, according to another embodiment of the inventive concept. Referring to FIG. 21, the memory system 400 includes a memory device 410 and a memory controller 420. The memory device 410 includes a memory cell array 411, a write/read circuit 412, and control logic 413. Also, the write/read circuit 412 includes a page buffer 412_1. In the present embodiment, the memory controller 420 further includes a read-retry controller 421, a data determiner 422, and information storage 423. In the embodiment of FIG. 21, the data determiner 422 is arranged in the memory controller 420, but as in the previous embodiment of FIG. 20, the data determiner 422 may be arranged in the memory device 410.

As stated in the previous embodiment, the read-retry controller 421 controls generation operations performed in a read-retry mode, and the data determiner 422 performs a data determination operation on multiple pieces of data that are read from cell regions, according to different read conditions. As a result of the data determination operation, a valley of the resistance level distribution of memory cells of a read-target page is predicted, and a read condition that corresponds to the valley of the resistance level distribution is selected.

The memory cell array 411 includes multiple pages, and different read conditions are selected for the multiple pages. For example, a resistance level distribution may be shifted in each of the pages of the memory cell array 411, so that a read condition that corresponds to a valley of the resistance level distribution may differ in each of the pages. The information storage 423 stores multiple pieces of information about the read conditions that correspond to the pages, respectively. Afterward, in a normal read operation, the memory controller 420 refers to the pieces of information about the read conditions stored in the information storage 423, and provides the memory device 410 with information about the read condition that corresponds to the read-target page.

Figure 22:
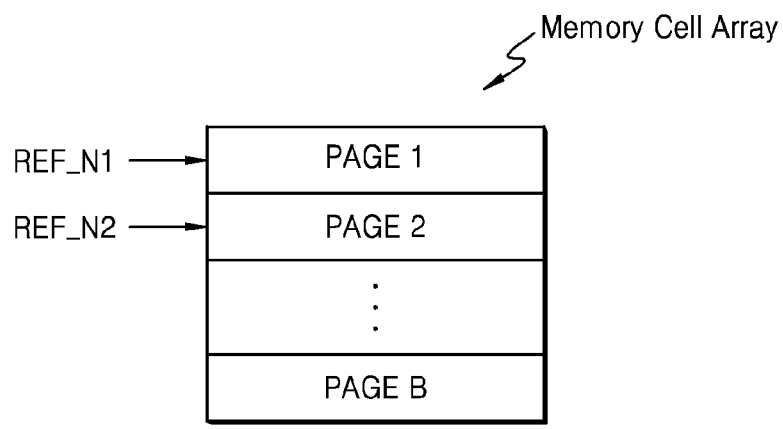
FIGS. 22, 23A, and 23B are block diagrams of examples in which information is stored in various regions of memory cells in the embodiment of FIG. 21.
Figure 23A:
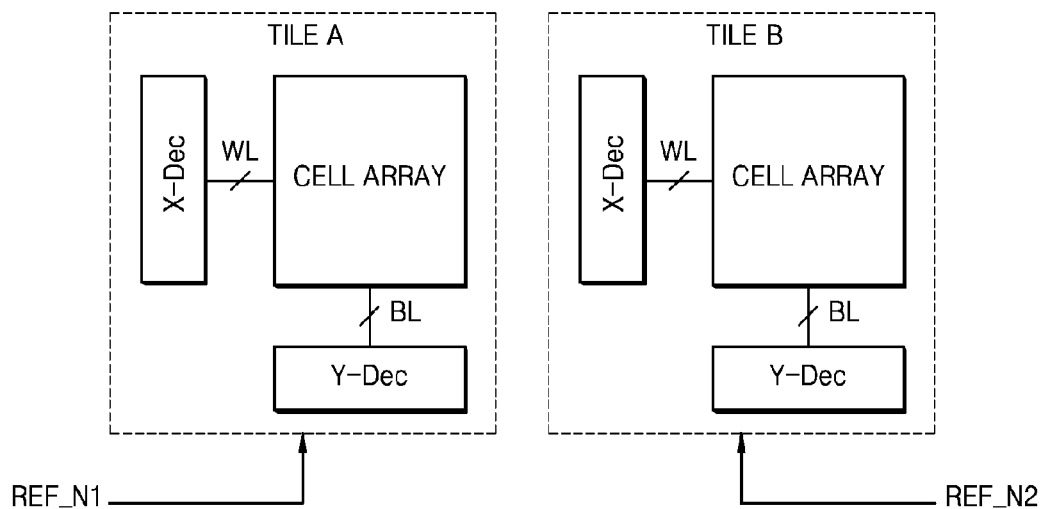
Figure 23B:
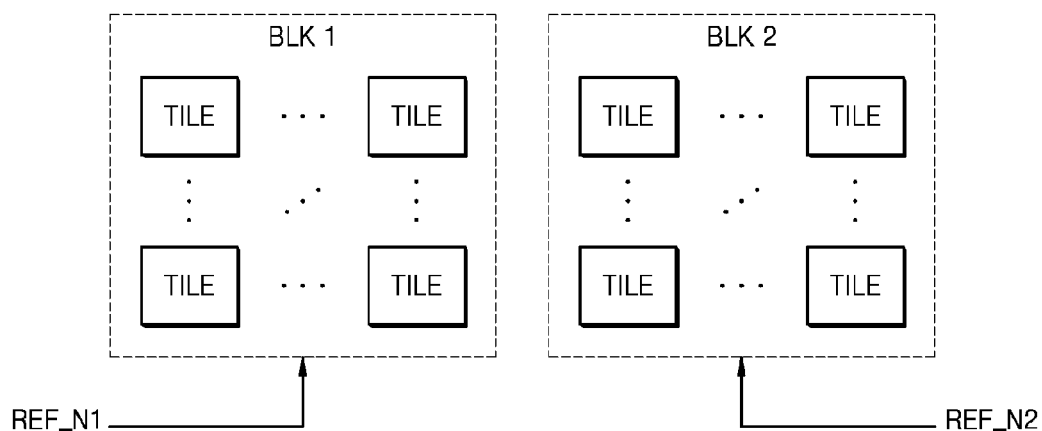

FIGS. 22, 23A, and 23B are block diagrams of examples in which information is stored in various regions of memory cells in the embodiment of FIG. 21. In the examples of FIGS. 22, 23A and 23B, multiple pieces of data are read, based on different read conditions, from cell regions of a page, respectively, in a read-retry mode, a read condition for minimizing the number of errors is selected therefrom, and read reference information related to the selected read condition is stored in a memory controller. Also, according to the stored read reference information, a read operation may be performed as a normal read operation on each of regions using different read conditions (e.g., a normal read condition), according to the stored read reference information.

As illustrated in FIG. 22, a memory cell array may include multiple pages, e.g., B pages PAGE 1 through PAGE B, and a read condition may differ in each of the pages. For example, a first read condition (e.g., a first normal read condition REF_N1) may be set for the first page PAGE 1, and a second read condition (e.g., a second normal read condition REF_N2) may be set for the second page PAGE 2. The read reference information for setting the read condition with respect to each of the pages may be stored in the memory controller, and in the normal read operation, data may be read from each of the pages, based on different read conditions, according to the read reference information.

The memory cell array may be defined according to tiles. For example, each of the tiles may include memory cells, and wordlines and bitlines that are connected to the memory cells. Also, the tile may include a row decoder and a column decoder, where the row decoder is commonly connected to the wordlines and the column decoder is commonly connected to the bitlines. In the embodiment of FIG. 23A, for example, a tile TILE A and a tile TILE B are shown.

Referring to the tile TILE A, as described in previous embodiments, the tile TILE A may include multiple pages and, in a read-retry mode, multiple pieces of data may be read from cell regions of each of the pages using different read conditions. Afterward, the resistance level distribution of memory cells may be analyzed by performing a data determination operation thereon, and a valley of the resistance level distribution may be predicted. A read condition REF_1 for commonly minimizing error occurrence in the pages of the tile TILE A may be selected and stored, and then data may be read based on the read condition REF_1 in the next normal read operation. Similarly, a read condition REF_2 may be selected and stored for the tile TILE B, and data may be read based on the read condition REF_2 in the next normal read operation. The example of FIG. 23A may be efficiently applied to a case in which resistance level distributions of tiles are shifted in a similar way.

The memory cell array may be defined according to blocks, and each of the blocks may include multiple tiles. In the example of FIG. 23B, a first block BLK 1 and a second block BLK 2 are shown, where each of the first block BLK 1 and the second block BLK 2 may include multiple tiles.

Referring to the first block BLK 1, as described in previous embodiments, in a read-retry mode, multiple pieces of data may be read from cell regions of each of pages of each of the tiles using different read conditions. A read condition REF_1 for commonly minimizing error occurrence in the pages of the first block BLK 1 may be selected and stored, and then data of the first block BLK 1 may be read based on the read condition REF_1 in the next normal read operation. Similarly, a read condition REF_2 may be selected and stored for the second block BLK 2, and data of the second block BLK 2 may be read based on the read condition REF_2 in the next normal read operation. The example of FIG. 23B may be efficiently applied to a case in which resistance level distributions of the blocks are shifted in a similar way.

In the examples of FIGS. 23A and 23B, only ECC-correctable errors may occur via read operations using the reference conditions REF_1 and REF_2, but uncorrectable errors may occur in some pages. In this case, a read-retry mode may be performed on the some pages, and the time required for the read-retry mode may be decreased by applying the present embodiment thereto. Also, since read reference information is pre-stored based on a prediction result on a valley of the resistance level distribution, the number of times that the read-retry mode starts may be decreased.

Figure 24:
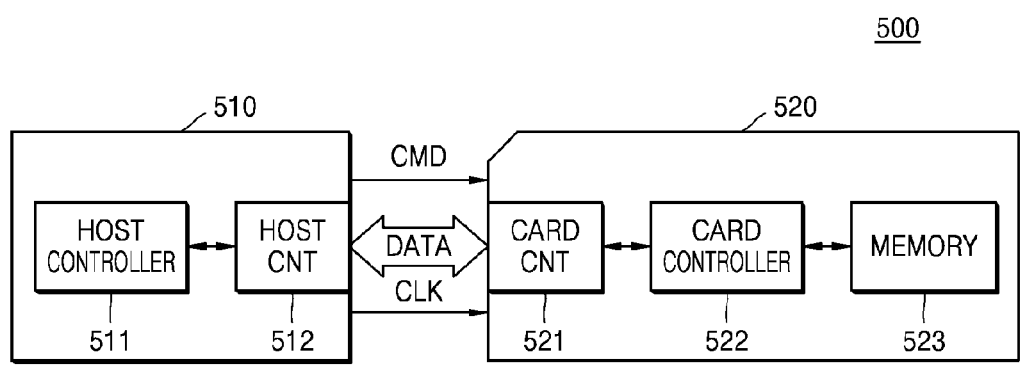
FIG. 24 is a block diagram of an example in which a memory system is applied to a memory card system, according to an embodiment of the inventive concept.

FIG. 24 is a block diagram of an example in which a memory system is applied to a memory card system 500, according to an embodiment of the inventive concept. It is assumed that the memory system is a resistive memory system.

Referring to FIG. 24, the memory card system 500 includes a host 510 and a memory card 520. The host 510 includes a host controller 511 and a host connector 512. The memory card 520 includes a card connector 521, a card controller 522, and a memory device 523. Here, the memory device 523 may be embodied using one of the embodiments shown in FIGS. 1 through 23, so that, in a read-retry mode, the memory device 523 may perform read operations using various read conditions, and an operation of setting a read condition according to a prediction result of a valley in the resistance level distribution.

The host 510 may write data to the memory card 520 or may read data stored in the memory card 520. The host controller 511 may transmit a command CMD, a clock signal CLK generated by a clock generator (not shown) in the host 510, and data DATA to the memory card 520 via the host connector 512.

In response to a command CMD received via the card connector 521, the card controller 522 may store data DATA in the memory device 523, in synchronization with a clock signal that is generated by a clock generator (not shown) in the card controller 522. The memory device 523 may store the data DATA transmitted from the host 510.

The memory card 520 may be embodied as a Compact Flash Card (CFC), a microdrive, an SMC, an MMC, a Security Digital Card (SDC), a memory stick, or a USB flash memory drive, for example.

Figure 25:
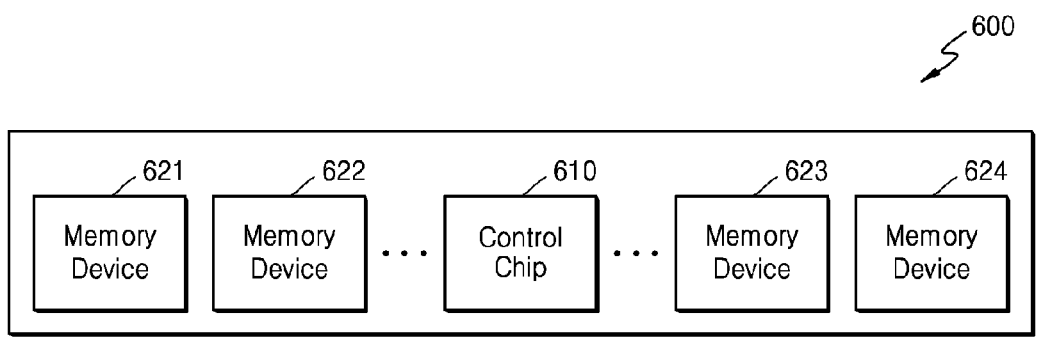
FIG. 25 illustrates a memory module, according to an embodiment of the inventive concept.

FIG. 25 illustrates a memory module 600, according to an embodiment of the inventive concept. It is assumed that the memory module 600 is a resistive memory module.

Referring to FIG. 25, the memory module 600 includes memory devices 621 through 624, and a control chip 610. Each of the memory devices 621 through 624 may be embodied using one of the embodiments shown in FIGS. 1 through 23. In response to various signals transmitted from an external memory controller, the control chip 610 controls the memory devices 621 through 624. For example, according to various commands and addresses transmitted from an external source, the control chip 610 may activate the memory devices 621 through 624 corresponding to the various commands and addresses, and thus control write and read operations. Also, the control chip 610 may perform various post processing operations on read data output from each of the memory devices 621 through 624, e.g., the control chip 610 may perform error detection and correction on the read data.

In the present embodiment, each of the memory devices 621 through 624 may operate in a read-retry mode, under control of the control chip 610. In the read-retry mode, each of the memory devices 621 through 624 may perform read operations using various read conditions and an operation of setting a read condition according to a prediction result on a valley of the resistance level distribution.

Figure 26:
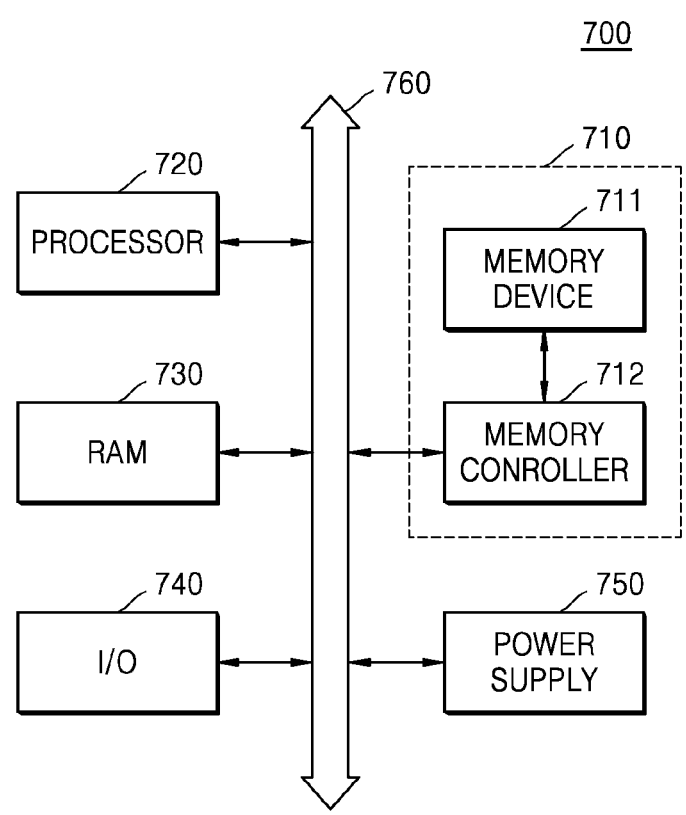
FIG. 26 is a block diagram of a computing system including a memory system, according to an embodiment of the inventive concept.

FIG. 26 is a block diagram of a computing system 700 including a memory system, according to an embodiment of the inventive concept. It is assumed that the memory system is a resistive memory system.

Referring to FIG. 26, the computing system 700 includes a memory system 710, a processor 720, RAM 730, an input/output (I/O) device 740, and a power supply device 750. The memory system 710 includes a memory device 711 and a memory controller 712. Although not illustrated in FIG. 26, the computing system 700 may further include ports for communication with a video card, a sound card, a memory card, a USB device, or other electronic devices, for example. The computing system 700 may be embodied as a personal computer (PC), or a portable electronic device, such as a notebook computer, a mobile phone, a personal digital assistant (PDA), or a camera, for example.

The processor 720 performs particular calculations and/or tasks. In the present embodiment, the processor 720 may be a micro-processor, a Central Processing Unit (CPU), or the like. The processor 720 may communicate with the RAM 730, the I/O device 740, and the memory system 710 via a bus 760, such as an address bus, a control bus, or a data bus, for example. Here, the memory system 710 and/or the RAM 730 may be embodied using the memory device of one of the embodiments shown in FIGS. 1 through 23.

In the present embodiment, the processor 720 may also be connected to an extended bus, such as a Peripheral Component Interconnect (PCI) bus.

The RAM 730 stores data for operations of the computing system 700. As described above, the memory device according to the one or more embodiments of the inventive concept may be applied to the RAM 730. DRAM, mobile DRAM, SRAM, PRAM, FRAM, and/or MRAM may be used as the RAM 730.

The I/O device 740 may include an input unit, such as a keyboard, a keypad, and/or a mouse, and an output unit, such as a printer and/or a display, for example. The power supply device 750 supplies an operating voltage for the operations of the computing system 700.

While the inventive concept has been particularly shown and described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method of operating a memory device, the method comprising:
    starting a read-retry mode;
    reading data of a plurality of cell regions using different read conditions in one re-read loop; and
    setting a final read condition for the cell regions, according to results of data determination operations on data read from the cell regions.

2. The method of claim 1, wherein the read-retry mode is started when the number of errors that occurs in data read from the cell regions via a normal read operation is greater than a threshold value.

3. The method of claim 1, wherein the data of the cell regions are simultaneously read using the different read conditions and are simultaneously stored in a page buffer.

4. The method of claim 1, wherein the data of the cell regions are sequentially read and are sequentially stored in a page buffer.

5. The method of claim 1, wherein:
the results of the data determination operations predict a valley of a resistance level distribution of the cell regions, and
a read condition corresponding to the predicted valley is set as the final read condition.

6. The method of claim 1, further comprising:
reading the data of the plurality of cell regions by commonly using the final read condition, wherein
when the number of errors that occur in the data read using the final read condition is greater than a threshold value, the method further comprises repeatedly performing a read operation for the cell regions using different read conditions; and setting the final read condition according to results of the data determination operations on the read data.

7. The method of claim 1, further comprising:
reading the data of the cell regions by commonly using the final read condition, wherein
when the number of errors that occur in the data read using the final read condition is equal to or less than a threshold value, the method further comprises ending the read-retry mode.

8. The method of claim 1, wherein:
the cell regions comprise a first cell region and a second cell region, and first data and second data that are respectively read from the first cell region and the second cell region are stored in a page buffer, and
the first data are read from the first cell region based on a first read condition and the second data are read from the second cell region based on a second read condition.

9. The method of claim 8, wherein:
each read condition comprises at least one of factors comprising a clamping signal, a precharge voltage, a precharge enable signal, a reference voltage, a reference current, and a sensing enable signal that are usable in reading the data, and
the first read condition and the second read condition differ from each other in at least one of the factors comprising the clamping signal, the precharge voltage, the precharge enable signal, the reference voltage, the reference current, and the sensing enable signal.

10. The method of claim 8, wherein each of the first cell region and the second cell region is an error correction code (ECC) unit.

11. A method of operating a memory system comprising a memory cell array, which comprises at least one page comprising a first cell region and a second cell region, the method comprising:
starting a read-retry mode, according to a result of error detection performed on data that was read from the at least one page;
storing, in a page buffer, first data read from the first cell region based on a first read condition;
storing, in the page buffer, second data read from the second cell region based on a second read condition different from the first read condition; and
setting a final read condition based on an analysis result of a resistance level distribution of each of the first data and the second data that are stored in the page buffer, wherein
the first data and the second data are read using different read conditions in one re-read loop.

12. The method of claim 11, further comprising:
reading data from each of the first cell region and the second cell region, based on the final read condition; and
ending the read-retry mode.

13. The method of claim 11, wherein setting the final read condition comprises setting a read condition from the first read condition and the second read condition as the final read condition, and wherein the read condition minimizes occurrence of data errors.

14. The method of claim 11, wherein setting the final read condition comprises setting a read condition as the final read condition that is different from the first read condition and the second read condition, according to the analysis result of the resistance level distribution of each of the first data and the second data.

15. The method of claim 11, further comprising:
ending the read-retry mode; and
reading, in a normal read mode, the data of the at least one page using a read condition that is equal to the final read condition for the at least one page.

16. The method of claim 11, wherein:
the at least one page comprises first through Ath cell regions (where A is an integer that is equal to or greater than 2), and
the page buffer comprises storage regions for storing a plurality of pieces of data from the first through Ath cell regions.

17. The method of claim 11, wherein a read operation on the first cell region based on the first read condition and a read operation on the second cell region based on the second read condition are simultaneously performed.

18. The method of claim 11, wherein a read operation on the first cell region based on the first read condition and a read operation on the second cell region based on the second read condition are sequentially performed.

19. A method of operating a memory system comprising a memory controller, the method comprising:
receiving, using the memory controller, data of a plurality of cell regions read based on a first normal read condition;
determining whether to start a read-retry mode for the cell regions, according to a result of error detection performed on the data of the cell regions;
controlling, in the read-retry mode, the data to be read from the plurality of cell regions based on different read conditions;
analyzing a resistance level distribution of each of the data read from the cell regions based on the different read conditions; and
controlling the data to be read from the cell regions based on a final read condition, according to the analysis result of the resistance level distribution, wherein
the data of the plurality of cell regions are read using the different read conditions in one re-read loop of the read-retry mode.

20. The method of claim 19, further comprising controlling a read condition to be the final read condition, wherein the read condition minimizes error occurrences and is from among the different read conditions used in reading the cell regions.

21. The method of claim 19, wherein the data of the cell regions are simultaneously read using the different read conditions.

* * * * *